(12) United States Patent
Steensgaard-Madsen

(10) Patent No.: US 6,573,790 B2
(45) Date of Patent: Jun. 3, 2003

(54) WIDE-BANDWIDTH OPERATIONAL AMPLIFIER

(75) Inventor: Jesper Steensgaard-Madsen, New York, NY (US)

(73) Assignee: Esion LLC, Carlsbad, CA (US)

(*) Notice: Subject to any disclaimer, the term of this patent is extended or adjusted under 35 U.S.C. 154(b) by 0 days.

(21) Appl. No.: 09/759,618

(22) Filed: Jan. 12, 2001

(65) Prior Publication Data

US 2002/0003441 A1 Jan. 10, 2002

Related U.S. Application Data

(63) Continuation of application No. PCT/IB99/01279, filed on Jul. 13, 1999.
(60) Provisional application No. 60/092,625, filed on Jul. 13, 1998.

(30) Foreign Application Priority Data

Jul. 13, 1999 (WO) .............................. PCT/IB99/01279

(51) Int. Cl.[7] ................................................ H03F 1/36
(52) U.S. Cl. ...................... 330/107; 330/109; 330/294
(58) Field of Search ................................. 330/107, 109, 330/294, 303

(56) References Cited

U.S. PATENT DOCUMENTS

| | | | |
|---|---|---|---|
| 4,559,502 A | | 12/1985 | Huijsing et al. |
| 4,980,651 A | | 12/1990 | Koullias |
| 5,155,447 A | | 10/1992 | Huijsing et al. |
| 5,485,121 A | | 1/1996 | Huijsing et al. |
| 5,486,790 A | | 1/1996 | Huijsing et al. |
| 5,625,317 A | * | 4/1997 | Deveirman ............. 330/109 |
| 5,646,575 A | | 7/1997 | Sauer don Roy |
| 5,854,573 A | | 12/1998 | Chan |
| 5,880,634 A | * | 3/1999 | Babanezhad ............. 330/107 |

FOREIGN PATENT DOCUMENTS

EP 0 463 880 A1 1/1992

OTHER PUBLICATIONS

Fan You et al.; "Multistage Amplifier Topologies with Nested Gm–C Compensation" IEEE Journal of Solid–State Circuits, vol. 32, No. 12, 1997.
International search report for parent application (PCT/IB99.01279) established Jul. 13, 1999.

\* cited by examiner

Primary Examiner—Robert Pascal
Assistant Examiner—Khanh Van Nguyen

(57) ABSTRACT

An operational amplifier (opamp) [74] coupled in a negative-feedback configuration [82] [84] comprising a driving opamp [76]; a linear controller [78]; and a mechanism [80] controlling the driving opamp's [76] offset. A voltage signal $V_{in}$ provided by the feedback network [82] [84] characterizes all errors caused by the driving opamp [76]. The controller [78] monitors this voltage and minimizes the signal-band spectral components thereof by inducing an offset in the driving opamp [76]. The offset control mechanism [80] has approximately constant gain and only little phase delay in the signal band. The controller [78] may be a linear high-order Chebychev filter providing substantial gain in a wide frequency range, thereby efficiently suppressing all signal-band errors, including noise, harmonic distortion, and slew-rate errors, caused by the driving opamp [76]. The controller's [78] frequency response can be designed essentially independently of the feedback network's [82][84] feedback factor.

The operational amplifier [74] is a general-purpose circuit. Important applications include video amplifiers and current-to-voltage conversion for asynchronous-digital-subscriber-line (ADSL) modems.

20 Claims, 15 Drawing Sheets

WIDE-BANDWIDTH OPERATIONAL AMPLIFIER

1 CROSS REFERENCE TO RELATED APPLICATIONS

This invention is based on and claims priority and is a continuation from PCT application PCT/IB99/01279 filed Jul. 13, 1999, which is based on and claims priority from U.S. Provisional Patent Application No. 60/092,625 filed Jul. 13, 1998.

2 FIELD OF INVENTION

The field of invention is analog electrical circuits, more particularly, this invention relates to operational amplifiers with increased gain in a wide bandwidth.

3 DESCRIPTION OF PRIOR ART

Figure 1:
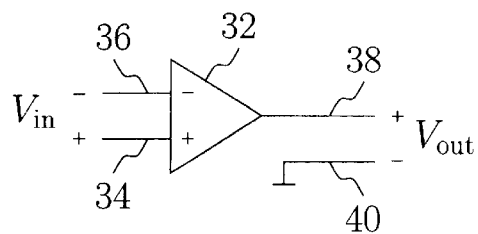

An operational amplifier, hereinafter referred to as an "opamp," is a general building block used in numerous analog electrical circuits. The symbol used to represent a general-purpose opamp [32] is shown in FIG. 1. A differential-input single-ended-output opamp [32] has a non-inverting input terminal [34], an inverting input terminal [36], and an output terminal [38], the voltage $V_{out}$ of which is defined with respect to a ground terminal [40]. In the ideal case, the two input terminals [34] and [36] are high-impedance terminals, i.e., they do not conduct any current, and the output voltage $V_{out}$ is a factor of A higher than the differential input voltage $V_{in}$, where the gain A approaches infinity. In principle, the output voltage $V_{out}$ will depend only on the voltage difference $V_{in}$ between the two input terminals [34] and [36], not on their average voltage with respect to the ground terminal [40], i.e., the common-mode input voltage. Hence, for an ideal infinite-gain opamp the ground terminal's [40] potential is somewhat arbitrary.

Figure 2:
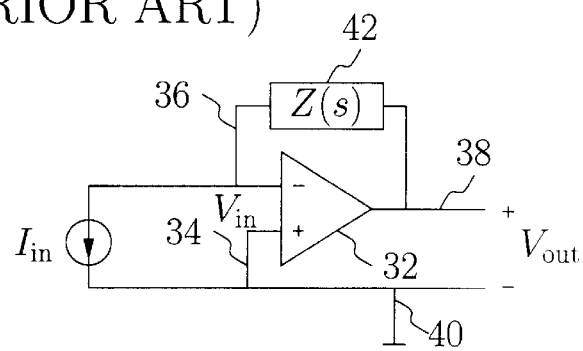

Opamps are generally used in feedback configurations. FIG. 2 shows a typical feedback configuration which may be used, for example, for current-to-voltage conversion in combination with a current-mode digital-to-analog converter. The reference potential for the output voltage $V_{out}$ is obtained by connecting the non-inverting input terminal [34] to the ground terminal [40]. If the opamp's [32] gain A is indeed infinite and the system is stable, the inverting input terminal [36] will have the same potential as the ground terminal [40]. A linear impedance element [42] is connected between the inverting input terminal [36] and the output terminal [38]. The impedance element [42] is a one-port network, usually consisting of only resistors, capacitors, and possibly also inductors, which here is described by the Laplace-transformed impedance Z(s). Hence, the output voltage is described by the Laplace-transformed relationship $$V_{out}(s) = Z(s) \cdot I_{in}(s). \quad (1)$$

Physical opamps are not ideal. The gain A is not infinite, and variations in the output voltage $V_{out}$ are delayed with respect to variations in the input voltage $V_{in}$. For small signals the opamp can be characterized by a transfer function, $$V_{out}(s) = H_{opamp}(s) \cdot V_{in}(s). \quad (2)$$

The opamp's [32] gain A(f) is frequency-dependent, typically with a high static value $A_{dc} = H_{opamp}(0)$. When taking Equation 2 into account, Equation 1 takes the form $$V_{out}(s) = Z(s) \cdot I_{in}(s) - V_{in}(s) = \frac{Z(s) \cdot I_{in}(s)}{1 + 1/H_{opamp}(s)}. \quad (3)$$

One of the difficulties in using non-ideal opamps is that the closed-loop system, e.g. the circuit shown in FIG. 2, may become unstable if the system's open-loop frequency response $H_{OL}(s)$ is not properly designed. The open-loop frequency response $H_{OL}(s)$ is the product of the opamp's frequency response $H_{opamp}(s)$ and the feedback network's frequency response $\beta(s)$. The feedback network's frequency response $\beta(s)$ can be evaluated as $$\beta(s) = \frac{-V_{in}(s)}{V_{out}(s)}$$

when the opamp is removed from the circuit, provided that its input/output impedances are properly modeled. The accurate calculation of the open-loop frequency response $H_{OL}(s)$ requires some experience, but it is discussed in several textbooks and taught at most electrical engineering schools; hence the concept is well-known to those ordinarily skilled in the art. For the closed-loop circuit shown in FIG. 2, the feedback network's frequency response is $\beta(s)=1$, and thus, $H_{OL}(s) = H_{opamp}(s)$.

3.1 Stability

Stability/instability can be determined using one of several stability criterions. Nyquist's stability criterion will be used for the following discussion. Nyquist's stability criterion states that the closed-loop system will be stable if the polar plot of $H_{OL}(s)$, $s = j2\pi f$, $f \in R$, does not encircle the point −1, otherwise the system will be unstable. For all real systems, $H_{OL}(j2\pi f)$ and $H_{OL}(-j2\pi f)$ are complex-conjugate values, hence it is sufficient to plot $H_{OL}(j2\pi f)$ for positive values of f only (and connect $H_{OL}(0)$ and $\lim_{f \to \infty} H_{OL}(j2\pi f)$ by a straight line).

Figure 3:
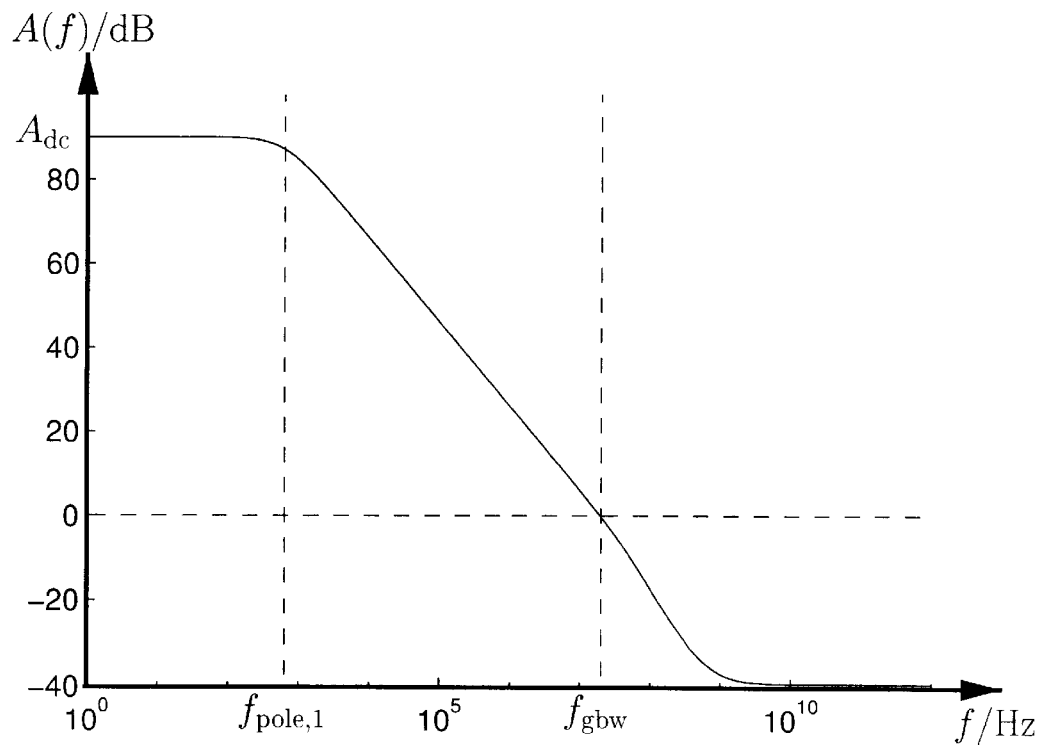

It is unavoidable that stray capacitors will make the angle $\phi(f)$ of an opamp's frequency response $H_{opamp}(j2\pi f) = A(f) \cdot e^{j \cdot \phi(f)}$, i.e., the phase response, uncontrollable at high frequencies, which is why it is necessary to reduce the gain A(f) to less than 1 at such high frequencies. Opamps are usually designed to have a frequency response similar to that shown in FIGS. 3, 4, and 5. FIG. 3 shows the opamp's gain A in deci Bell (dB) versus the frequency f in Hertz on a logarithmic scale. The opamp's unit-gain frequency, which is also called the opamp's gain-bandwidth frequency $f_{gbw}$, is an important parameter. The typical target opamp-gain characteristic is $A(f) = f_{gbw}/f = -20 \cdot \log_{10}(f/f_{gbw})$ dB, but the gain is generally limited at low frequencies. In other words, the opamp's frequency response has a pole at a low frequency $f_{pole,1}$. Although the low-frequency (dominating) pole $f_{pole,1}$ is intentional, the parameters $f_{pole,1}$ and $A_{dc}$ are usually somewhat undetermined; an opamp should be designed to have a well-controlled $f_{gbw}$, which is the most important parameter with respect to stability concerns.

Figure 4:
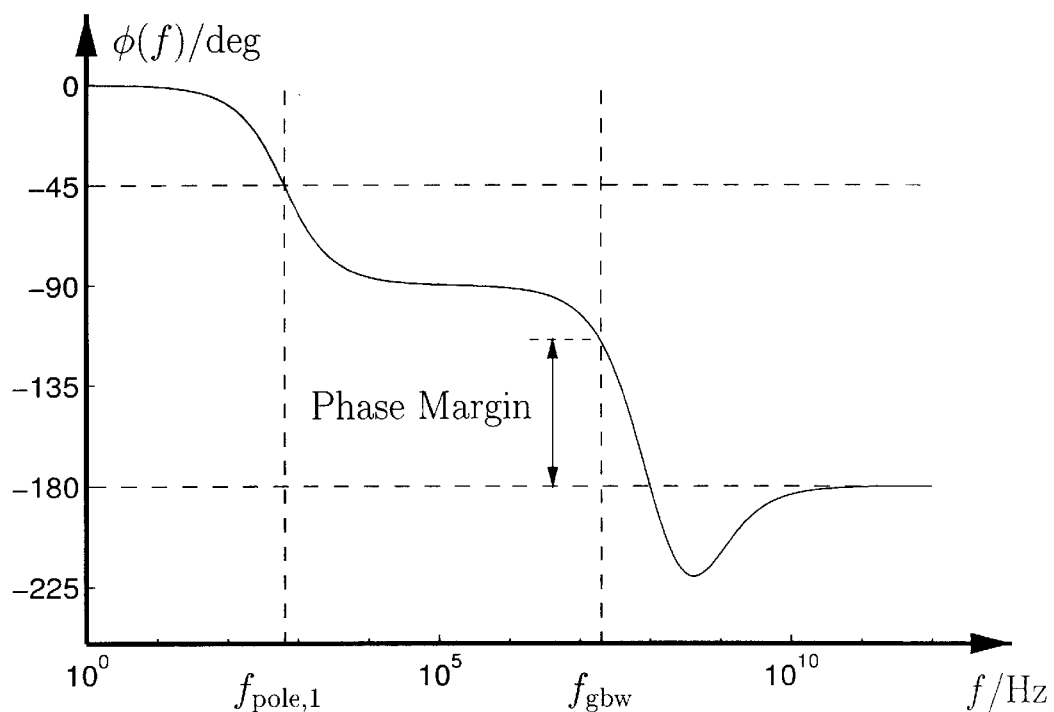

FIG. 4 shows a plot of the phase response $\phi(f)$ in degrees versus the frequency f. The phase margin is defined as $180° + \phi(f_{gbw})$. A general design rule is to make the phase margin at least 45°. This will generally require that $f_{gbw}$ is slightly lower that the opamp's first non-dominating non-canceled (undesired) pole/right-plane-zero. The achievable $f_{gbw}$ is dependent on the technology used and the power consumption allowed.

Figure 5:
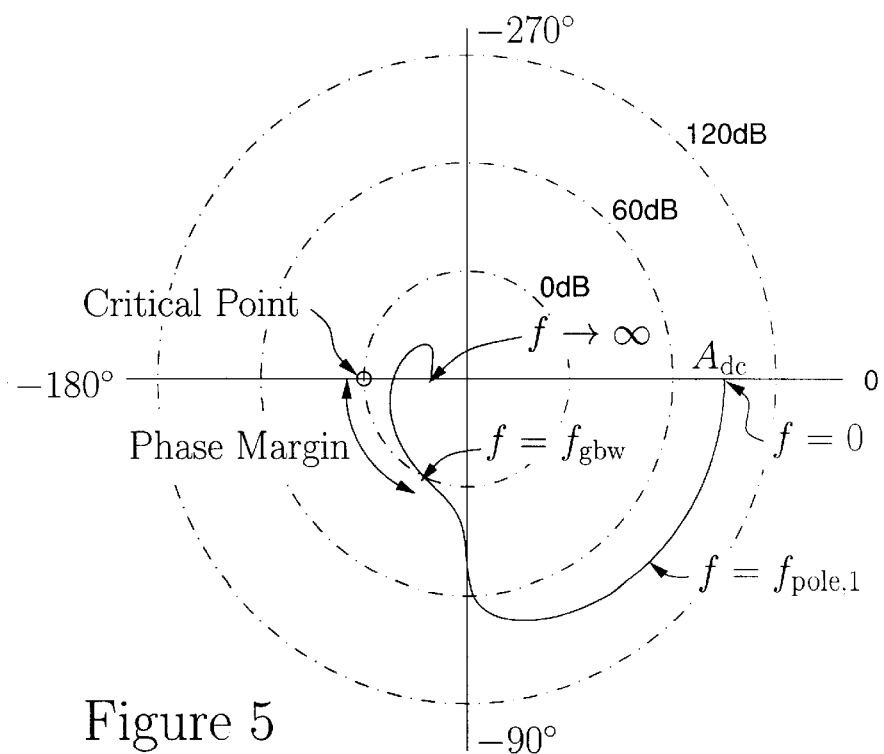

FIG. 5 shows a polar plot of the frequency response $H_{opamp}(j2\pi f)$; it is merely an alternative graphical representation of A(f) and φ(f). The respective closed-loop system, i.e., the circuit shown in FIG. 2, is stable because the curve does not encircle the critical point −1. Clearly, a large phase margin is preferable because that will avoid close proximity of the critical point and the area enclosed by $H_{opamp}(j2\pi f)$, $f \in R$ (which is the main stability concern).

3.2 Opamp Implementation

Figure 6:
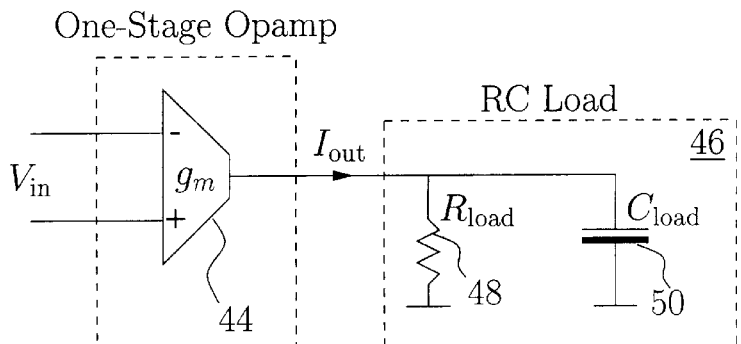

FIG. 6 shows the conceptual topology of a simple one-stage opamp (often also called an OTA). The opamp consists of only one transconductance stage [44] providing an output current $I_{out}$ proportional to the differential input voltage $V_{in}$, $$I_{out}(s) = g_m \cdot V_{in}(s). \tag{4}$$

Equation 4 is valid for frequencies up to a certain frequency f' only. Hence the gain of the opamp must be less than one at frequencies higher than f'. The opamp's voltage gain A(f) is determined by the load [46], which is modeled as a resistor [48] $R_{load}$ and a capacitor [50] $C_{load}$ connected in parallel. The opamp's static gain is $$A_{dc} = g_m \cdot R_{load} \tag{5}$$

and its unity-gain frequency is $$f_{gbw} = \frac{g_m}{2\pi C_{load}}. \tag{6}$$

Because the transconductance $g_m$ cannot be made arbitrarily high (for a limited power/current consumption), this type of opamp provides only relatively little static gain when driving a resistive load [48]. Because the unity-gain frequency (and thus the circuit's speed/stability) depends on the capacitive load [50], this opamp type is best suited for applications driving only on-chip capacitive loads; it is used frequently for the implementation of switched-capacitor circuits.

Figure 7:
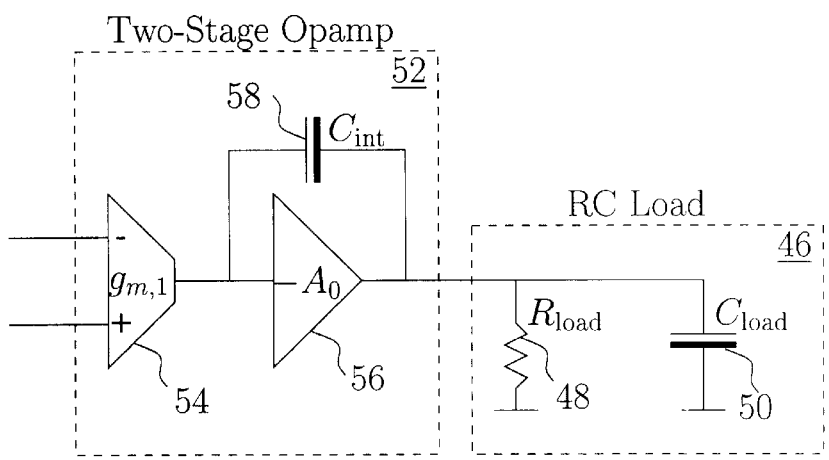

Multi-stage opamps are better suited to drive difficult loads, such as low-ohmic resistive loads, long cables, loudspeakers, etc. FIG. 7 shows the conceptual topology of a two-stage opamp [52]. The first stage is a differential-input transconductance stage [54]. This stage [54] is cascaded with an inverting amplifier [56] which should be powerful enough to drive the RC load [46] while providing gain $A_0$ greater than (say) 3 for frequencies lower than $f_{gbw}$. A compensation capacitor [58] $C_{int}$ provides negative feedback for the second stage [56], whereby the opamp's [52] frequency response will be approximately $$H_{opamp}(s) = \frac{g_m}{sC_{int}}. \tag{7}$$

Because $C_{int}$ is usually an on-chip capacitor, the system's speed/stability is relatively well-controlled and independent of the capacitive load $C_{load}$. The opamp's [52] static gain is the product of the static gain of the first stage [54] and the static gain of the second stage [56]. The static gain of the first stage [54] is the product of the transconductance $g_{m1}$ and the static impedance (ohmic load) of the node connecting the two stages [54] [56]. Dependent on the actual implementation, the first stage's [54] gain can be anywhere in the range from (say) 30 dB to 100 dB. The static gain of the second stage [56] is usually relatively smaller, say 30 dB.

Figure 8:
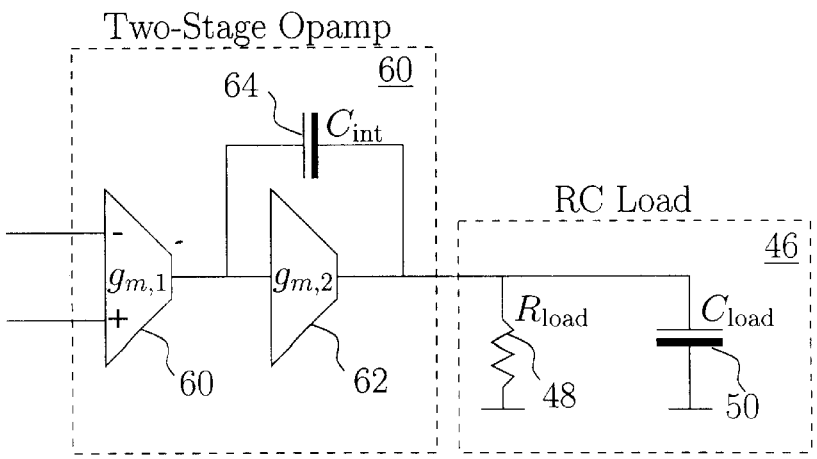

When the supply voltage is relatively low, the output stage of a multi-stage opamp is often merely a transconductance stage, as opposed to a voltage amplifier with a low output impedance. FIG. 8 shows the topology of a typical two-stage opamp with a transconductance output stage [62]. When the static gain $g_{m,2} \cdot R_{load}$ of the output stage [62] is relatively high, the higher output impedance does not pose a problem. However, when the resistive load [48] is low-ohmic, $g_{m,2} \cdot R_{load}$ may be quite low, possibly less than one. In that case the opamp's [60] gain is generated almost entirely in the first stage [60].

U.S. Pat. No. 4,559,502 (December 1985) to Huijsing et al. describes a multi-stage opamp with more than two stages, suitable for driving low-ohmic loads. A frequency response similar to that shown in FIGS. 3, 4, and 5 is obtained by using a so-called nested-miller compensation technique. In a nested-miller compensated opamp, multiple compensation capacitors are connected from the output node to intermediate nodes in-between the individual stages, see FIG. 9. The advantage of this technique is that a very high static gain can be obtained using only low-gain stages, but the overall unity-gain frequency and especially the slew-rate/power performance is degraded. The lower unity-gain frequency is caused by what is known as the right-plane-zero problem, i.e., the opamp's polarity is changed when the compensation capacitors, $C_2$, $C_3$, and $C_4$, short-circuit the respective transconductance stages, $g_{m,2}$, $g_{m,3}$, and $g_{m,4}$, a high frequencies. A variation of this technique, shown in FIG. 10, which overcomes this problem is discussed in U.S. Pat. No. 5,155,447 (October 1992), also to Huijsing et al., and by Fan You et al. (Multistage Amplifier Topologies with Nested $G_m$-C Compensation, IEEE Journal of Solid-State Circuits, Vol. 32, No. 12, 1997). U.S. Pat. No. 5,485,121 (January 1996) to Huijsing et al. and U.S. Pat. No. 5,854,573 (December 1998) to Chan are based on the same technique to avoid the change of polarity at high frequencies. U.S. Pat. No. 5,486,790 (January 1996) to Huijsing et al. discusses a hybrid-nested-miller compensation technique, whereby the capacitive load of the output terminal is reduced, thus improving the slew-rate/power ratio.

3.3 Large-Signal Wide-Band Operation

Gain and bandwidth parameters do not describe an opamp's performance in full detail. Both these parameters are based on the assumption that the opamp is a linear device, which is only rarely the case. In fact, if opamps were linear the gain response A(f) would often be of only secondary interest. However, opamps are generally quite nonlinear. The output stage is particularly nonlinear because it will exhibit a large voltage swing, and especially if it has to provide a large current to the load. However, provided the opamp has "infinite" gain, and that it is used in a negative-feedback configuration, e.g., as shown in FIG. 2, the external linearity will depend only on the feedback network's linearity. It is well-known that errors which occur in an opamp's output stage will be suppressed (when they are referred to the output) by the gain of the open-loop frequency response $H_{OL}(s) = \beta(s) \cdot H_{opamp}(s)$. Thus, if the opamp is designed to have the frequency response shown in FIGS. 3, 4, and 5, the external linearity will deteriorate as the signal frequency is increased relative to the opamp's unity-gain frequency. Asynchronous digital subscriber line (ADSL) modems, for example, have a signal bandwidth of several mega Hertz, and they require that the driver interfacing a long cable has a linearity of at least 80–90 dB. This is very hard to achieve. Using standard design techniques, this level of performance will require that the opamp per se is relatively linear, and that it has a very high unity-gain frequency, say in the giga-Hertz range. Considering that the capacitive load generally is quite large, it will be understood that drivers for ADSL modems are a very challenging design problem.

Another significant problem inherent to most opamps is that errors caused by the first stage are not suppressed at all. Slew-rate limitation is a well-know example of this problem. Consider the two-stage opamp shown in FIG. 7. The voltage swing of the internal node connecting the two stages [54] and [56] is generally relatively small. Thus, when the output voltage changes, approximately the same voltage variation will occur across the compensation capacitor [58], and the input stage [54] must provide the required charge. The current that needs to be provided by the input stage [54] is proportional to the signal frequency and the magnitude of the opamp's [52] output voltage. Considering that the first stage's [54] linearity is generally a decreasing function of the magnitude of the current provided, it can be concluded that the linearity (once again) will deteriorate as the signal frequency is increased. In the extreme case, the input stage [54] will saturate, which results in slew-rate distortion. Clearly, the multi-stage structures shown in FIGS. 9 and 10 do not ease the requirements to the input stage because the voltage across the compensation capacitors will vary synchronously with the output voltage, thus requiring all the transconductance stages to provide current signals proportional to the signal frequency and magnitude.

A fundamental difficulty of designing opamps is that the optimization of the input stage's linearity, the minimization of the opamp's noise and power consumption, and the maximization of the unity-gain frequency are conflicting requirements. Consider, for example, the implementation of the two-stage amplifier shown in FIG. 11. The first transconductance stage [66] provides a differential output, for which the non-inverting output is used to implement a feedforward path [68] connected directly to the overall output [70]. The advantage of this technique is discussed by Huijsing in U.S. Pat. No. 5,485,121. Consider the design of the differential pair [72] generating the first stage's [66] transconductance $g_{m,1}$. A high transconductance $g_{m,1}$ is preferable to minimize the input-referred noise and to maximize the unity-gain frequency. The transconductance can be maximized by increasing the differential pair's [72] aspect ratio, but that will decrease the input stage's [66] linear range. The linearity can be improved by increasing the differential pair's [72] effective overdrive, or by inserting degenerative resistors (not shown) in series with the source terminals; both of which will deteriorate the opamp's power/speed ratio.

The conclusion is that it is difficult to achieve good external linearity at high signal frequencies. If the internal linearity is emphasized, the unity-gain frequency will be relatively lower and there will be less gain available to improve the linearity. On the other hand, if the unity-gain frequency, and thus the gain, is emphasized the linearity will be poor and relatively more gain needed to achieve the required level of external linearity.

4 SUMMARY

A linear wide-bandwidth negative-feedback system according to this invention comprises a high-speed driver and a slower linear controller selectively suppressing the error signal in the system's signal band.

4.1 Objects and Advantages

Accordingly, several objects and advantages of the present invention are to provide an operational amplifier circuit which can be used to drive difficult loads, such as for ASDL modems, and provide good external linearity in a wide bandwidth;

to provide an operational amplifier circuit for which the unity-gain frequency and the linearity can be optimized independently and simultaneously;

to provide a method for the design of stable closed-loop circuits based on operational amplifiers, for which the opamp gain A(f) can be vastly higher than $f_{gbw}/f$ for signal-band frequencies up to approximately $\frac{1}{10}$ of the unity-gain frequency $f_{gbw}$;

to provide an operational amplifier circuit for which errors caused by slew-rate limitation will be efficiently suppressed;

to provide a buffer circuit based on an open-loop feed-forward path and an operational amplifier, such that the feed-forward path's distortion is suppressed by the opamp's gain, and such that the opamp can be implemented with a relatively smaller output stage and, thus, with a relatively higher unity-gain frequency.

Further objects and advantages will become apparent from a consideration of the ensuing description, the drawings, and the claims.

5 DRAWING FIGURES

FIG. 1: The symbol used to represent a general-purpose opamp (PRIOR ART).

FIG. 2: Opamp in a typical negative-feedback configuration (PRIOR ART).

FIG. 3: Open-loop frequency response (gain) of a typical opamp (PRIOR ART).

FIG. 4: Open-loop frequency response (phase) of a typical opamp (PRIOR ART).

FIG. 5: Polar plot of the open-loop frequency response of a typical opamp (PRIOR ART).

FIG. 6: One-stage opamp with RC load (PRIOR ART).

FIG. 7: Two-stage opamp with RC load (PRIOR ART).

FIG. 8: Two-stage opamp with RC load (PRIOR ART).

Figure 9:
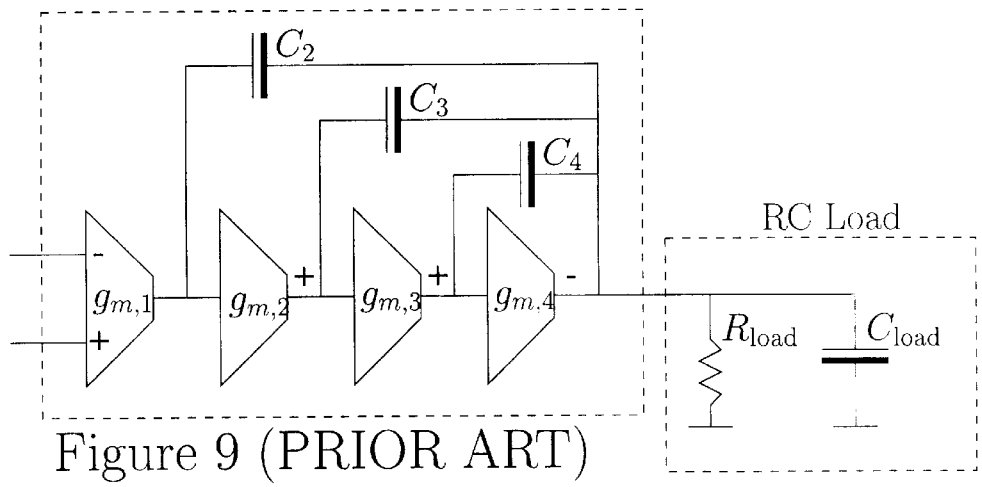

FIG. 9: Four-stage Nested-Miller Compensated (NMC) Opamp (PRIOR ART).

Figure 10:
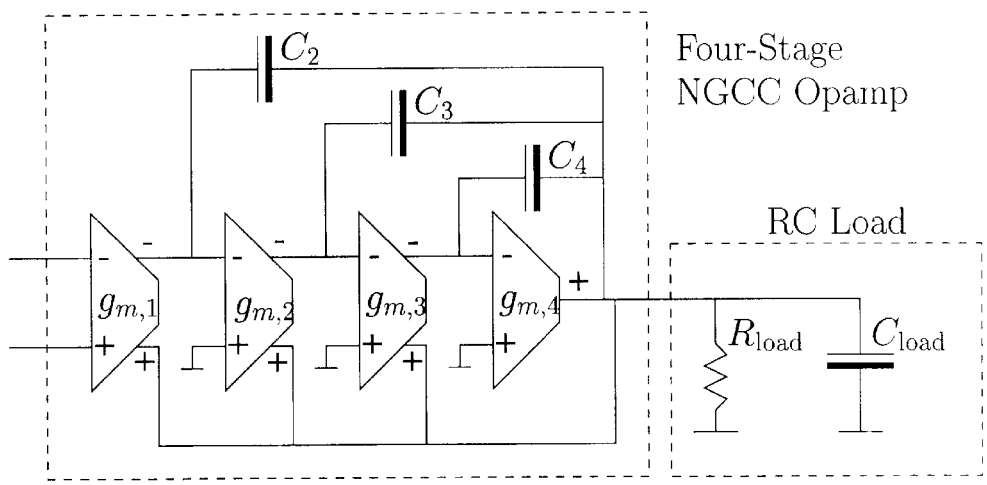

FIG. 10: Four-stage Nested-$G_m$C-Compensated (NGCC) Opamp (PRIOR ART).

Figure 11:
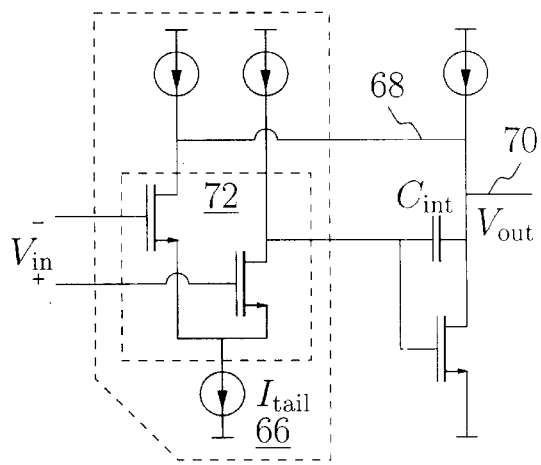

FIG. 11: Implementation of a two-stage opamp (PRIOR ART).

Figure 12:
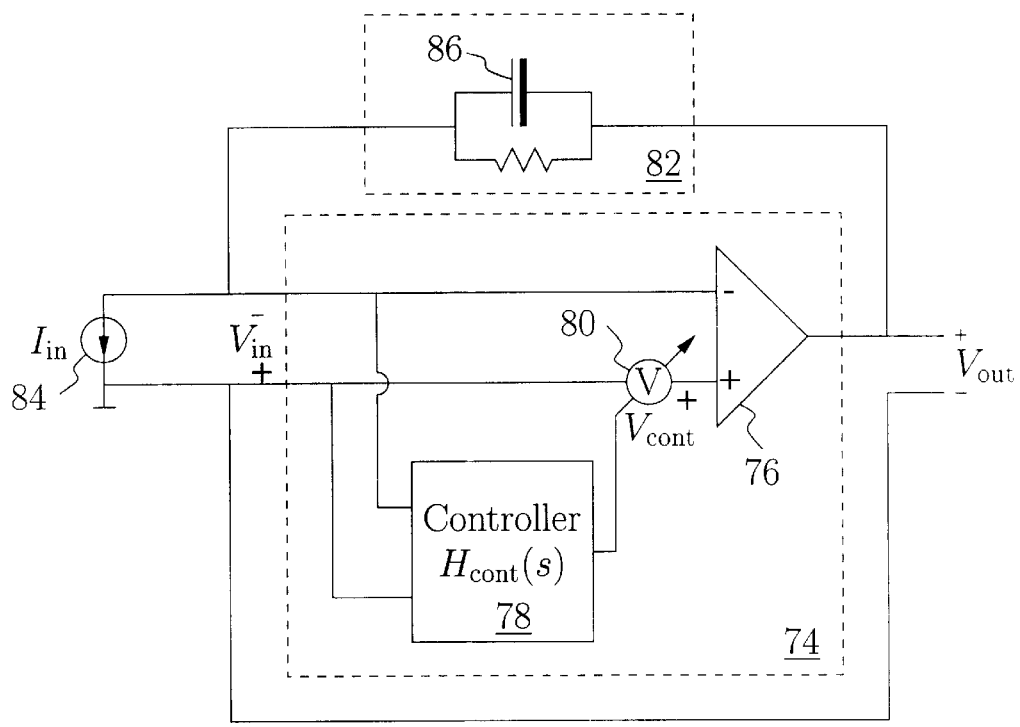

FIG. 12: Closed-loop circuit based on a distortion-shaping opamp.

Figure 13:
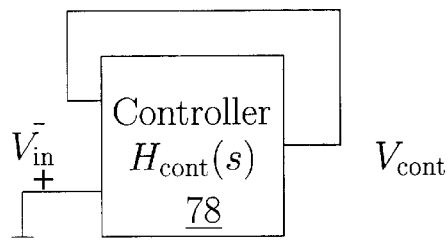

FIG. 13: Controller coupled in unity-gain amplifier configuration.

Figure 14:
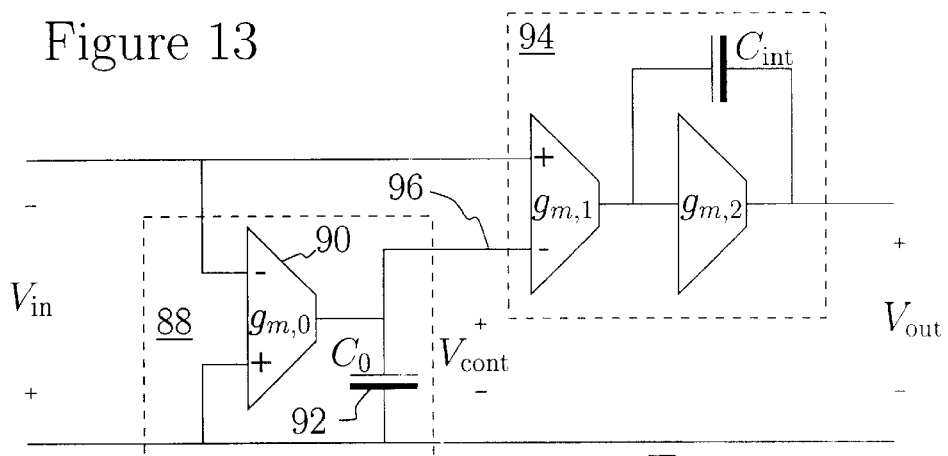

FIG. 14: Distortion-shaping opamp based on a first-order controller.

Figure 15:
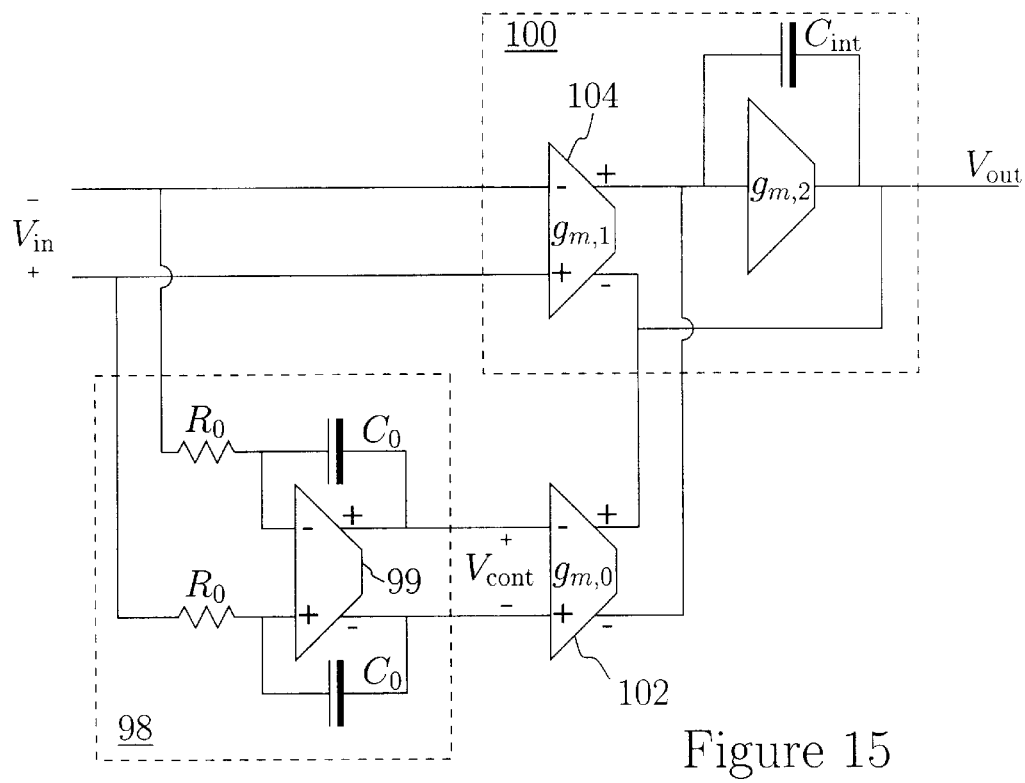

FIG. 15: Linearized distortion-shaping opamp based on a first-order controller.

Figure 16:
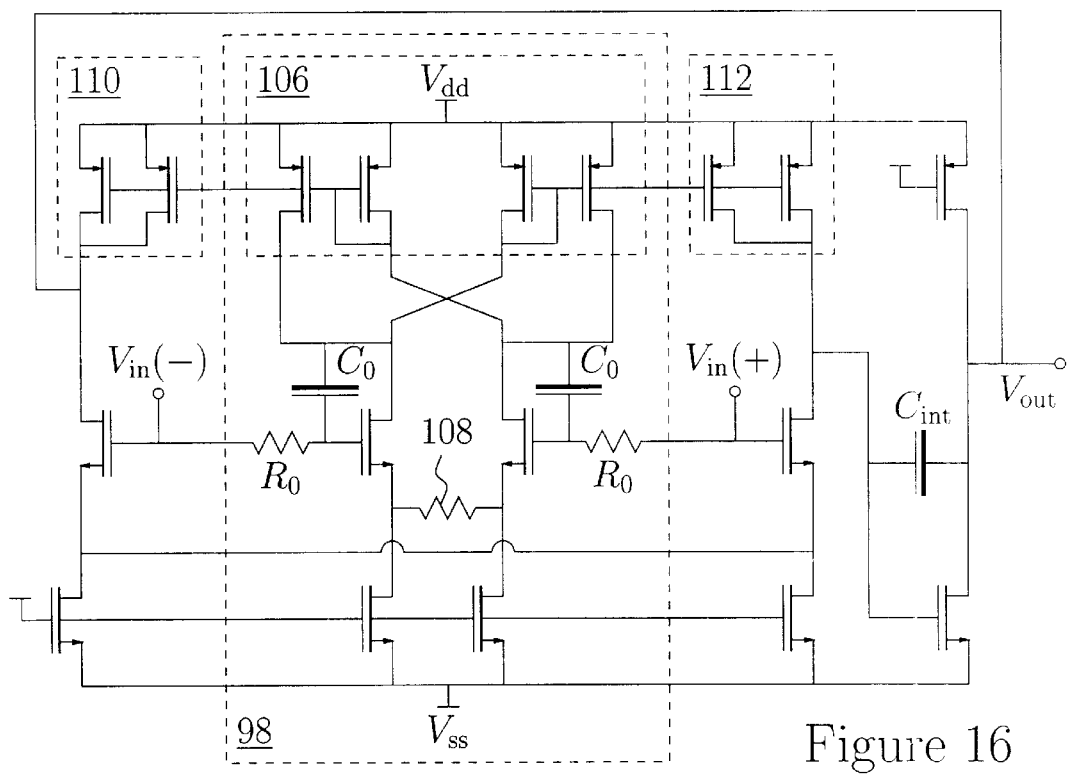

FIG. 16: Transistor-level implementation of FIG. 15.

Figure 17:
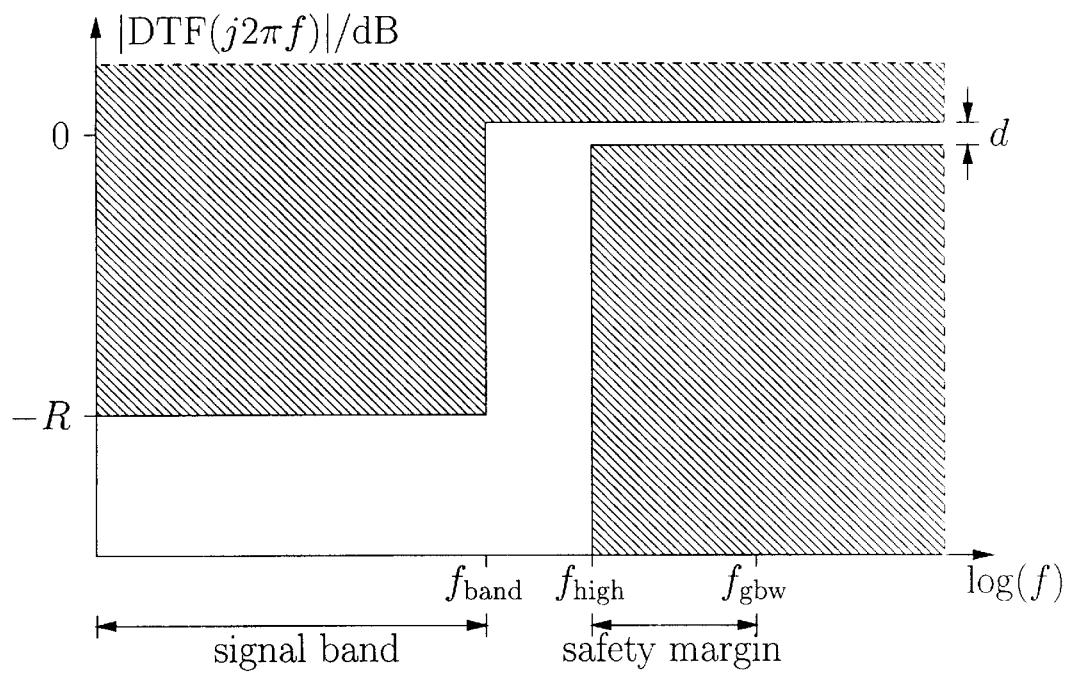

FIG. 17: Specification of a desired gain response of DTF(s).

Figure 18:
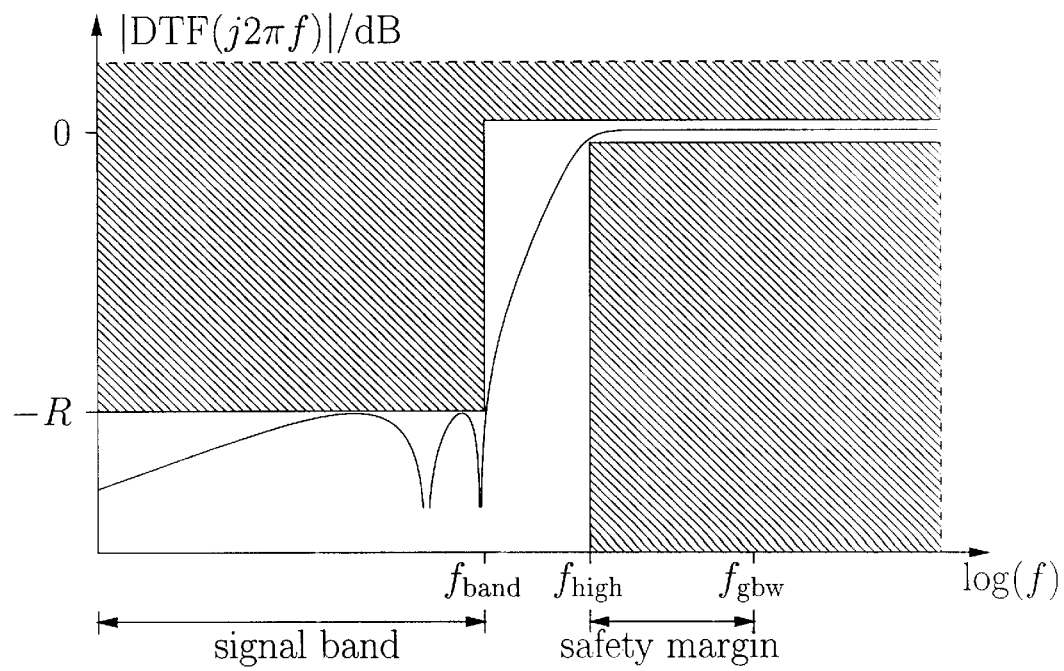

FIG. 18: Gain response of a 5th-order Chebychev Type-II high-pass filter.

Figure 19:
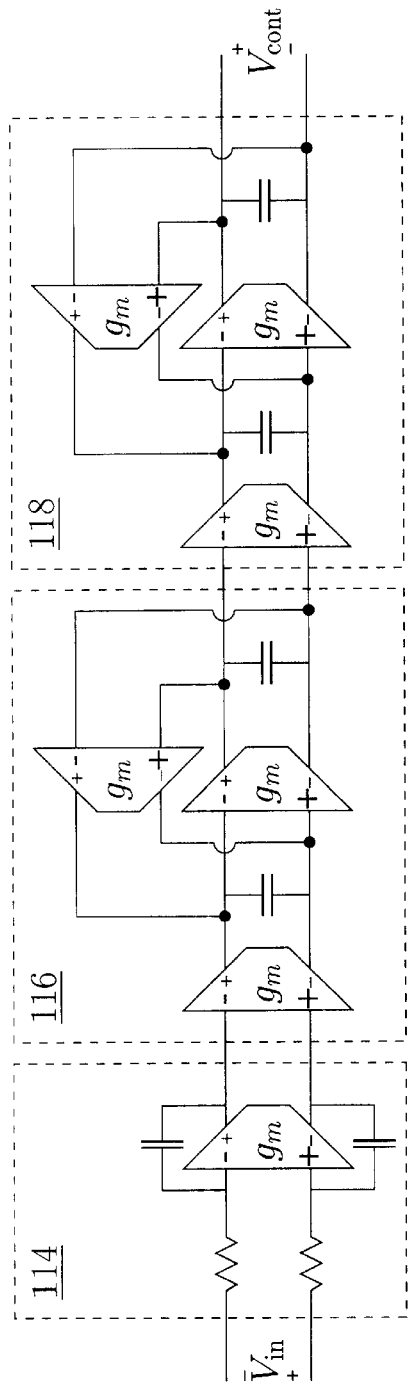

FIG. 19: $G_m$C-filter with all-imaginary poles.

Figure 20:
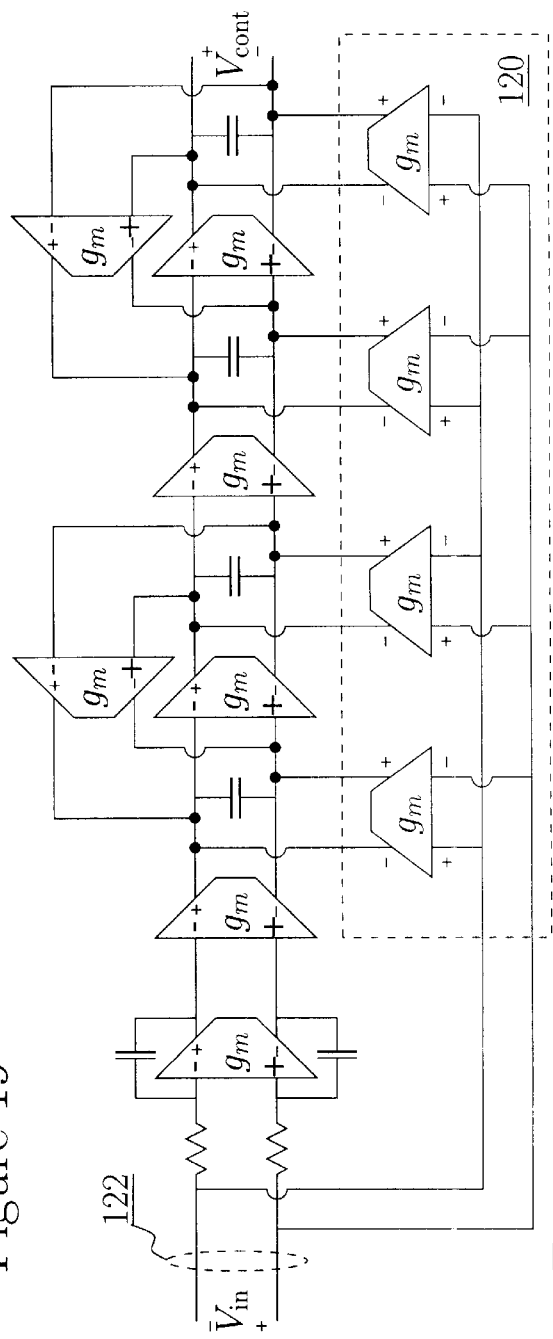

FIG. 20: $G_m$C-filter implementing $H_{cont}(s)$.

Figure 21:
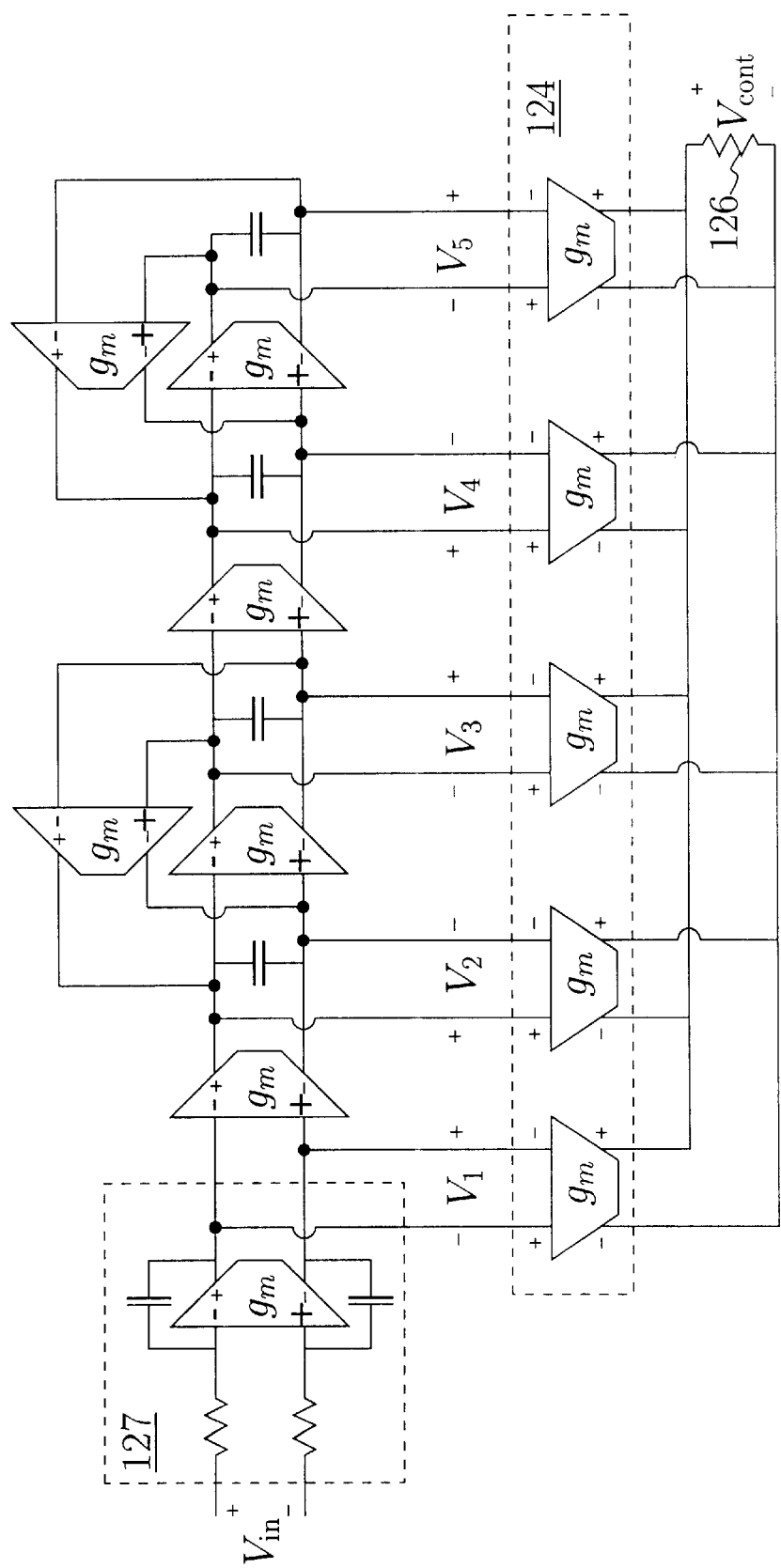

FIG. 21: $G_m$C-filter implementing $H_{cont}(s)$.

Figure 22:
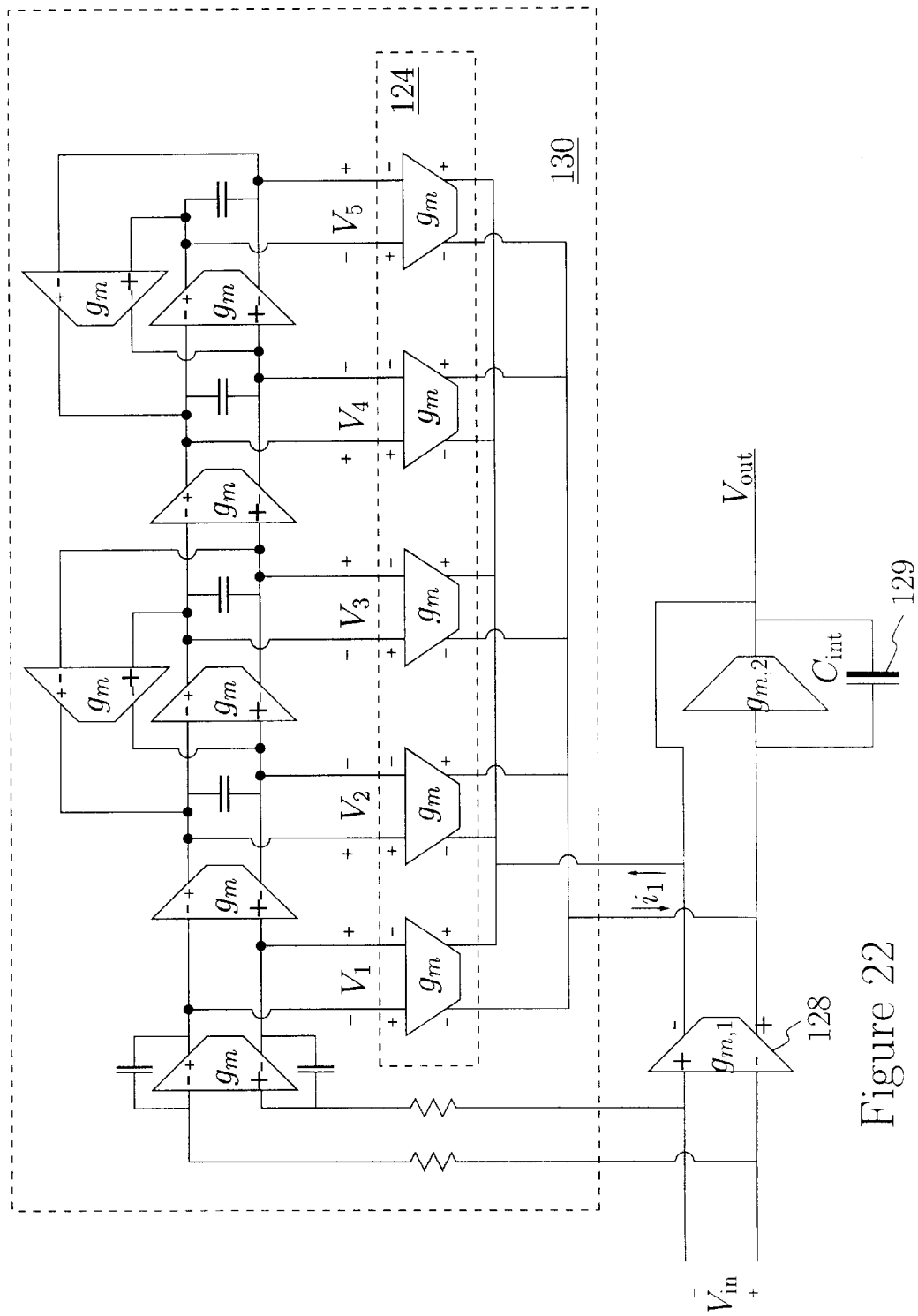

FIG. 22: 5th-order distortion-shaping opamp.

Figure 23:
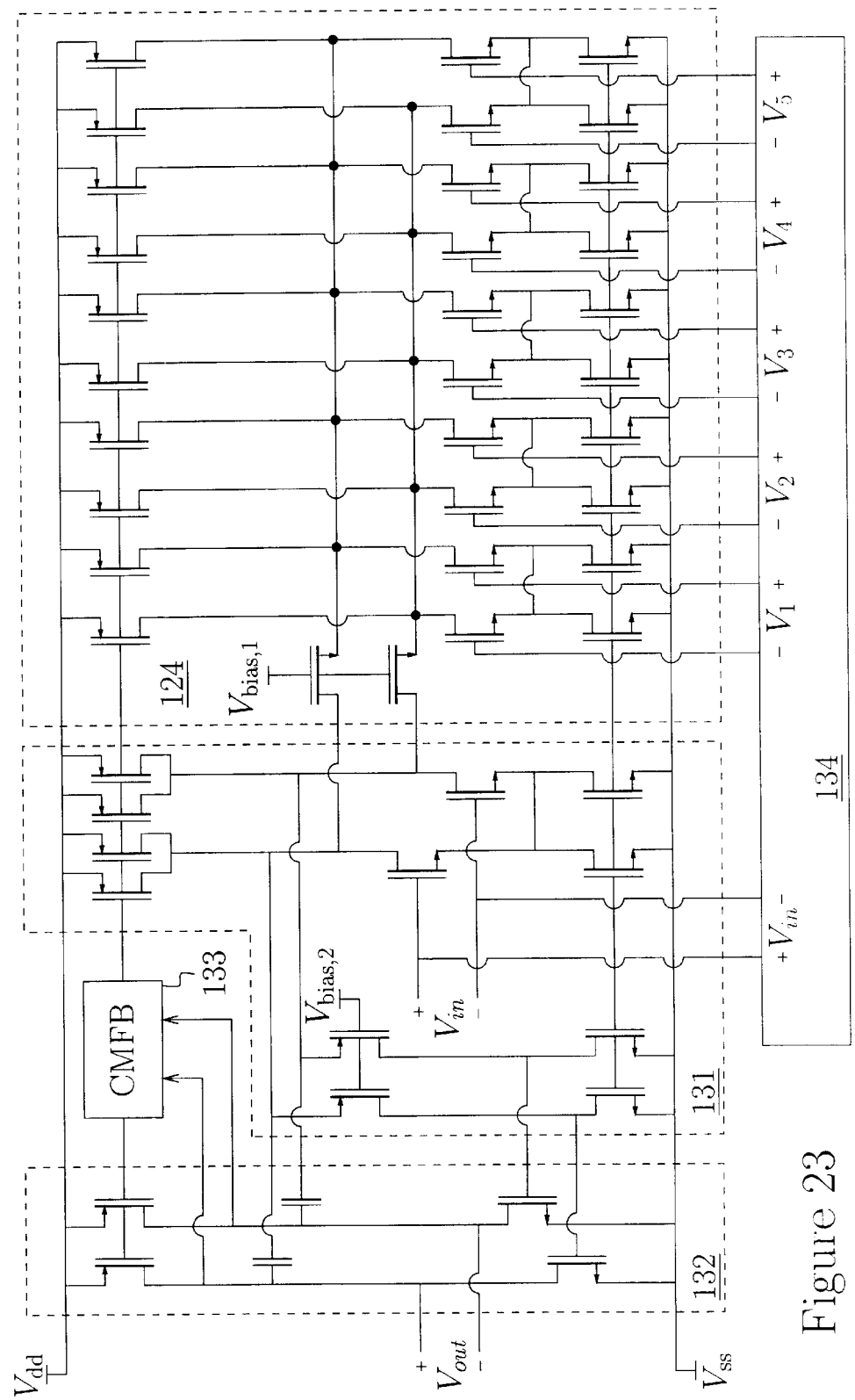

FIG. 23: Transistor-level example of 5th-order distortion-shaping opamp (part 1).

Figure 24:
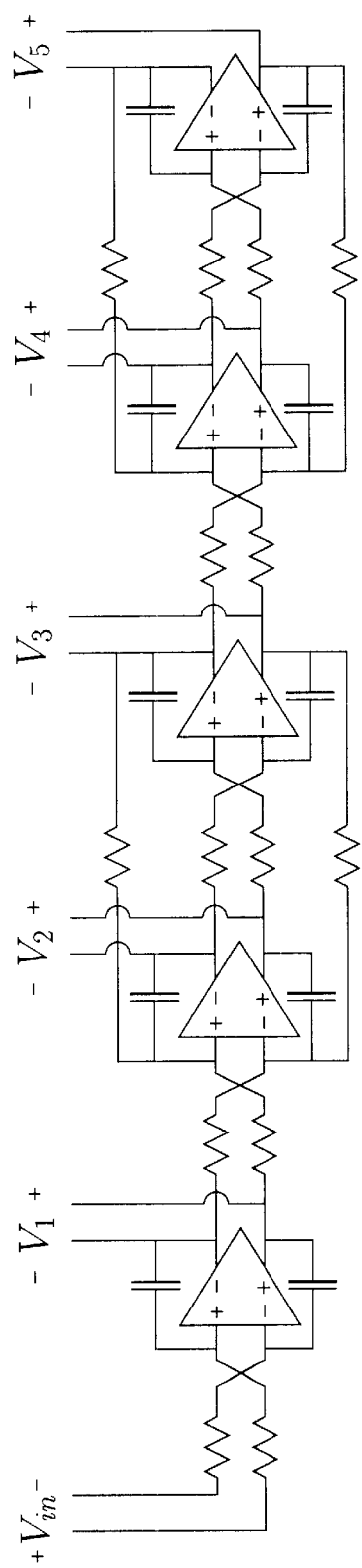

FIG. 24: Transistor-level example of 5th-order distortion-shaping opamp (part 2).

Figure 25:
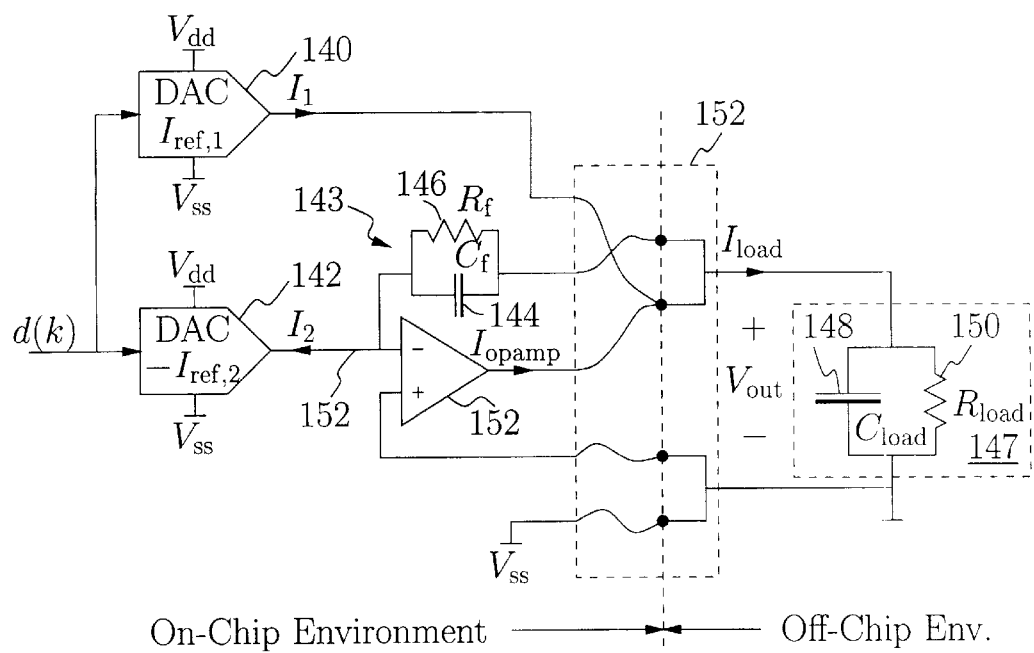

FIG. 25: D/A converter system with driving open-loop feed-forward path.

Figure 26:
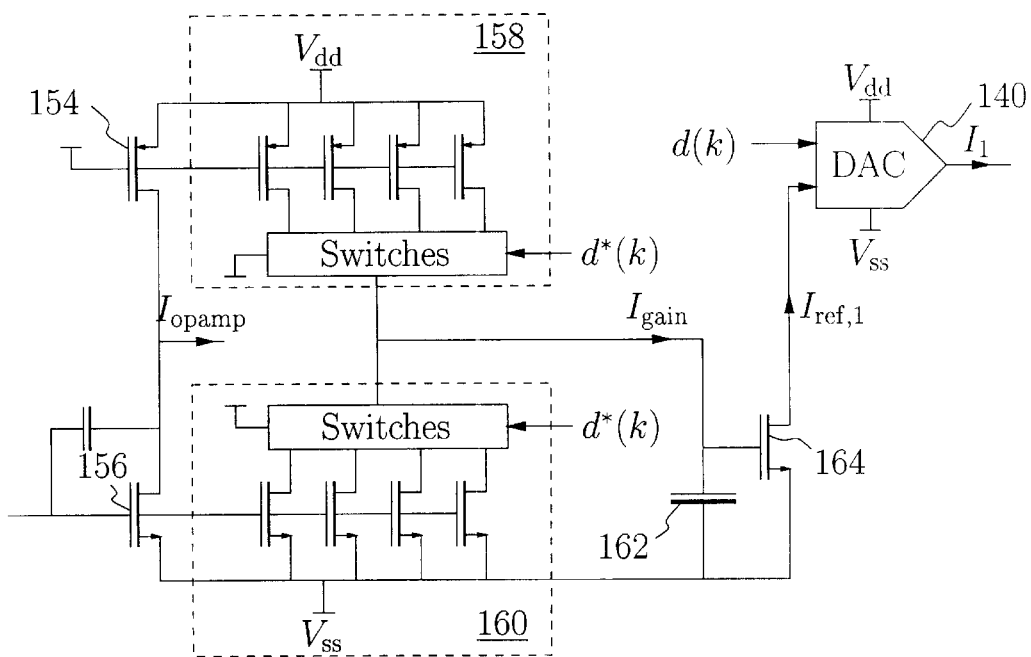

FIG. 26: Gain-control of driving feed-forward path.

Figure 27:
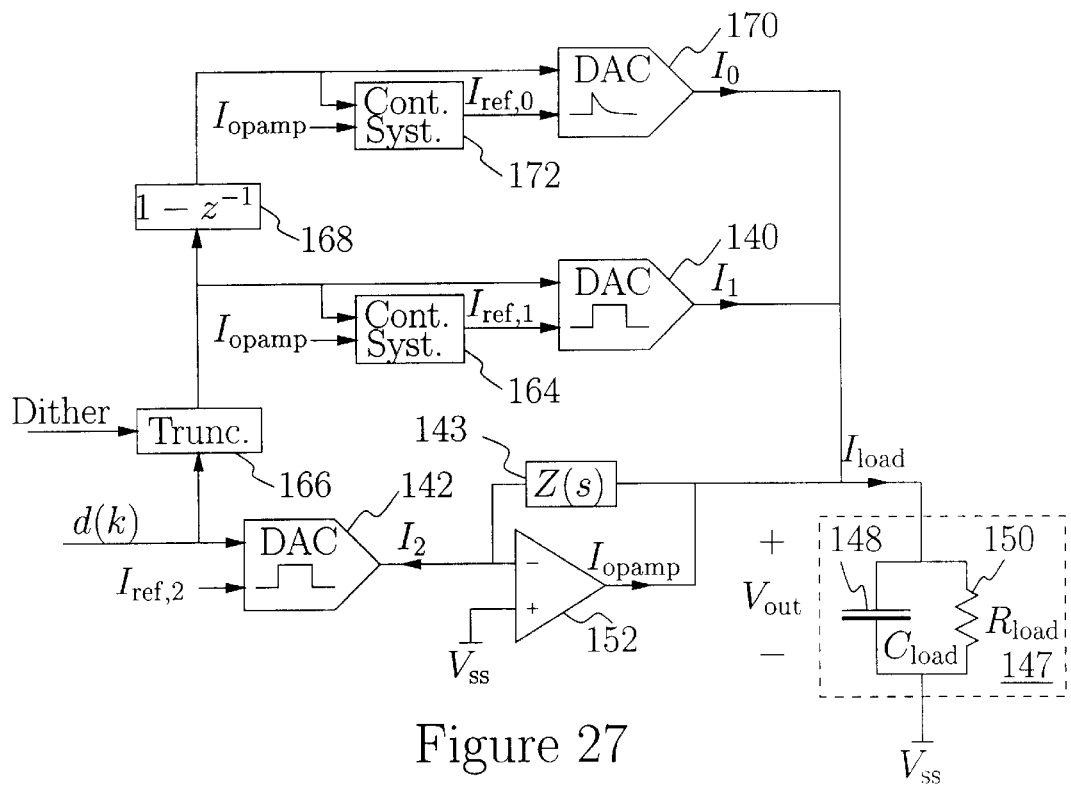

FIG. 27: D/A converter system with adaptive driving open-loop feed-forward path.

Figure 28:
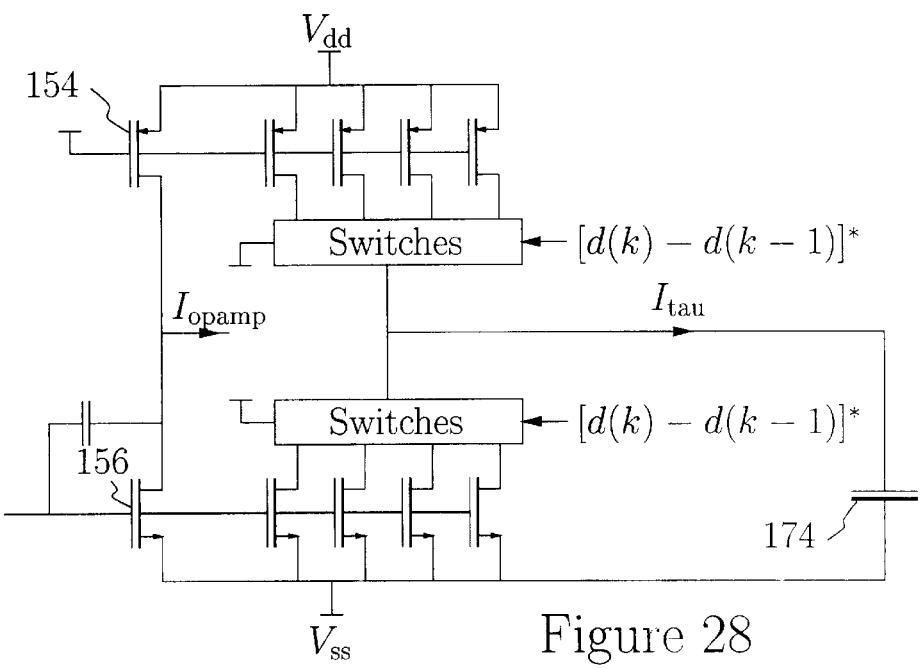

FIG. 28: Gain-control of differentiating feed-forward path.

Figure 29:
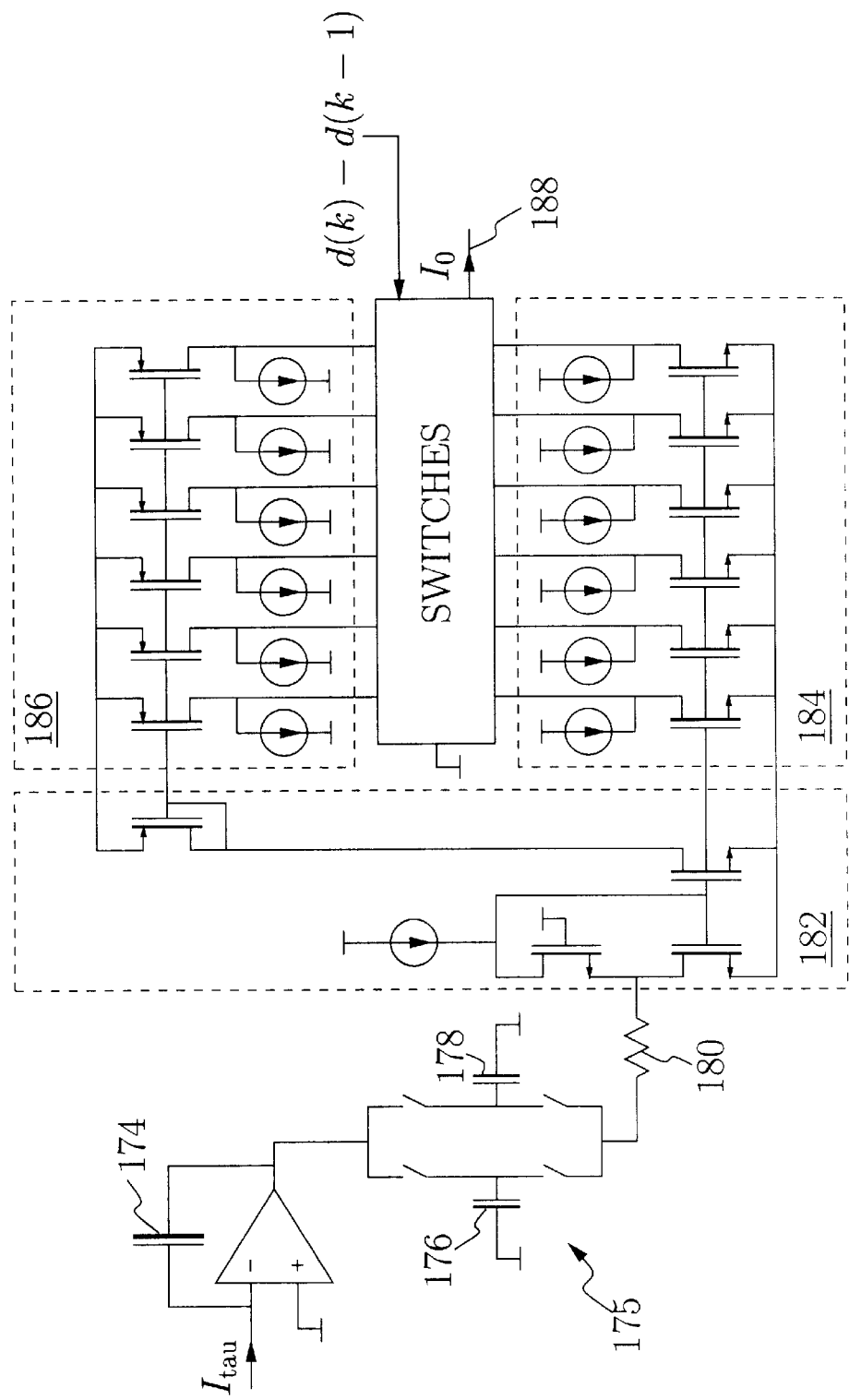

FIG. 29: Differentiating D/A converter with exponentially-decaying impulse response.

6 DESCRIPTION of PREFERRED EMBODIMENTS

The fundamental idea of a first aspect of this invention is the same as that of noise-shaping delta-sigma loops: instantaneous errors in the output signal are acceptable provided that the signal-band power of the error signal is negligible. Hence, it is meaningful to consider the proposed opamp circuits to be "distortion-shaping" opamps. FIG. 12 illustrates the basic concept of a distortion-shaping opamp [74]. The distortion-shaping opamp [74] consists of a traditional opamp [76], a controller [78], and a mechanism to control the driving opamp's [76] offset, here represented by an offset regulator [80]. The distortion-shaping opamp [74] is intended for use in a negative-feedback configuration, which here is represented by an impedance element [82] and an input current source [84]. Hence the ideal transfer function $V_{out}(s)/I_{in}(s)$ is similar to that of the circuit shown in FIG. 2.

The operation is as follows. The driving opamp [76] will, as any opamp in a stable negative-feedback configuration, always attempt to make $V_{in}$ as small as possible, ideally zero. If the driving opamp [76] is non-ideal, $V_{in}(s)$ will generally be in a nonlinear relationship to $I_{in}(s)$, and thus $V_{out}(s)$ will be in a nonlinear relationship to $I_{in}(s)$. However, if the driving opamp [74] is just reasonably good, it will manage to make the magnitude $V_{in}(t)$ relatively small, say less than 1/10 of the magnitude of $V_{out}(t)$. To assist the driving opamp [76] in keeping $V_{in}(t)$ small, the ideal output signal's spectral components at frequencies higher than (say) 1/10 of the driving opamp's [76] unity-gain frequency should be small. For example, if $I_{in}(t)$ is generated by a current-mode digital-to-analog converter with a zero-order-holding impulse response, it is preferable to include a capacitor [86] in the impedance element [82], such as to help suppress the high-frequency spectral replica images comprised in $I_{in}(t)$. Generally, the driving opamp [76] should be designed and optimized with respect to its unity-gain frequency, paying less attention to its linearity, offset, and noise performance.

The controller's [78] job is to monitor the driving opamp's [76] performance, and to make corrections for errors made. Notice that all errors caused by the driving opamp [76] are detectable by observing $V_{in}(t)$, thus making it possible to correct for slew-rate errors, noise, offset, and other errors caused by the driving opamp's [76] input stage. It is unreasonable to expect the controller [78] to compensate for deleterious spectral components (i.e., errors) at or above the driving opamp's [76] unity-gain frequency $f_{gbw}$. However, deleterious spectral components up to approximately $f_{gbw}/10$ can be compensated for very effectively, thus the distortion-shaping opamp [74] can provide a very good performance in an unusually wide signal bandwidth. Clearly, the controller [78] must be able to observe and evaluate $V_{in}(t)$ very accurately, i.e., it must have a very linear input stage.

An important concern is, of course, how to design the controller [78] such that the closed-loop system will be stable. A key observation that will lead to a simple and useful answer to this question is that the transfer function $V_{in}(s)/V_{cont}(s)$ is approximately unity for all frequencies up to about 1/10 of the driving opamp's [76] unity-gain frequency $f_{gbw}$ (footnote: the controller is disabled by applying $V_{cont}(s)$ for the calculation of $V_{in}(s)/V_{cont}(s)$). This observation is valid for the majority of the commonly used feedback networks, and not only when $\beta(s)=1$ (the feedback factor for the circuit shown in FIG. 12). Thus, the controller [78] should be designed such that it is stable when configured as a unity-gain amplifier, see FIG. 13, and with an open-loop gain $|H_{cont}(j2\pi f)|$ which is less than unity for frequencies higher than approximately $f_{gbw}/10$. To obtain effective suppression of errors caused by the driving opamp [76], the controller [78] should have as much gain as possible in the system's signal band.

6.1 First-Order Controller

A very simple option is to design the controller [78] as a single-pole opamp with a unity-gain frequency slightly lower than the driving opamp's [76] unity-gain frequency $f_{gbw}$. This is illustrated in FIG. 14, where new reference numerals have been used. The controller [88] is merely a transconductance stage [90], with transconductance $g_{m,0}$, loaded by a capacitor [92] $C_0$. The controller's [88] unity-gain frequency is $g_{m,0}/(2\pi C_0)$. The driving opamp [94] is implemented as a traditional two-stage opamp, already shown in FIG. 8. The driving opamp's [94] offset is controlled by applying the control voltage $V_{cont}$ directly to the opamp's noninverting input terminal [96]. The driving opamp's [94] unity-gain frequency is $f_{gbw}=g_{m,1}/(2\pi C_{int})$, and the ratio of the two unity gain frequencies is, therefore, $$\alpha = \frac{g_{m,0}}{g_{m,1}} \frac{C_{int}}{C_0}.$$

This ratio α should be less than 1, but not necessarily as low as 1/10. Because the controller [88] is a simple first-order one, this system will generally be stable, even when the ratio α is as large as 1/2.

The signal-band gain of this opamp circuit is approximately $A(f)=\alpha(f_{gbw}/f)^2$, and thus, the wide-band external linearity can be much better than that of the driving opamp [94] alone. Errors caused by the driving opamp [94] will be suppressed by the controller's [88] gain $A_{cont}(f)=\alpha f_{gbw}/f$, but errors caused by the controller [88] will not be suppressed. Hence, the controller's transconductance stage [90] should be made as linear as possible. Several well-known linearization techniques can be applied because the unity-gain frequency $g_{m,0}/(2\pi C_0)$ need not be as high as that of the driving opamp [94]. The most efficient linearization techniques involve the use of local negative feedback, e.g., using degenerative resistors connected in series with the source terminals of a differential pair.

FIG. 15 shows a distortion-shaping opamp with a single-pole controller [98] based on a gain stage [99] and a linear feedback network. The controller's [98] transfer function is $$H_{cont}(s) = \frac{V_{cont}(s)}{V_{in}(s)} = \frac{1}{sR_0C_0}. \tag{8}$$

The control of the driving opamp's [100] offset is implemented differently than it was for the distortion-shaping opamp shown in FIG. 14. The transconductance stage [102] converts the control voltage $V_{cont}$ into a current signal $V_{cont} \cdot g_{m,0}$ added to the current provided by the driving opamp's input stage [104]. Thus, the driving opamp [100] will have an induced offset of $V_{cont} \cdot (g_{m,0}/g_{m,1})$ FIG. 16 shows a detailed implementation of the distortion-shaping opamp shown in FIG. 15. The controller's [98] gain stage [99] is merely a single-stage opamp (cf. FIG. 6). Common-mode feedback [106] is required because it is a fully-differential controller [98]. The linearizing resistor [108] is optional; it may be a simple short circuit. The two transistors [110] and [112] control the driving opamp's operating point and implement also the controlling transconductance stage [102].

Again referring to FIG. 15, it may be worthwhile to point out the reasons why the distortion-shaping opamp will be more linear than the driving opamp [100] alone. A main advantage is obtained by assuring that the magnitude of $V_{in}$ is relatively small. Furthermore, $V_{cont}$ is a low-pass filtered representation of $V_{in}$ and its magnitude is small (assuming that $C_0$ is sufficiently large). Thus, the controller [98] can be made quite linear, and all errors caused by the driving opamp [100] will be suppressed by the loop gain $(g_{m,0}/g_{m,1})/(sC_0R_0)$.

6.2 Design of Higher-Order Controllers

Those who are skilled in the art of designing delta-sigma noise-shaping loops know that an improved signal-band performance and/or a wider bandwidth can be obtained by increasing the controller's order. This observation is equally valid for distortion-shaping opamps.

Now referring to FIG. 12, the overall objective is to design a controller [78] having substantial gain in the signal band; the more the better. However, to avoid instability, it is necessary to reduce the gain $|H_{cont}(j2\pi f)|$ to less than unity for frequencies higher than the driving opamp's [76] unity-gain frequency $f_{gbw}$. Furthermore, the controller [78] must be stable when configured as a unity-gain amplifier, i.e., all the poles of $$DTF(s) = \frac{1}{1 + H_{cont}(s)} \quad (9)$$

must have a negative real part (also known as "left-half-plane" poles). DTF(s) will be called the "distortion transfer function" because it reflects how much the input-referred errors caused by the driving opamp [76] will be amplified. Notice that errors caused by the driving opamp's [76] output stage will be suppressed by both the gain of the driving opamp's [76] input stage and by 1/DTF(s). Errors caused by the driving opamp's [76] input stage, such as slew-rate distortion, will be suppressed by 1/DTF(s) only. Clearly, it is preferable that the signal-band gain of DTF(s) is as small as possible. Thus, for opamps used for baseband applications, DTF(s) should be designed as a high-pass filter with substantial suppression in the stop band. Notice that because $|H_{cont}(j2\pi f)|$ should be small (ideally zero) for frequencies around $f_{gbw}$ and higher, DTF(s) will ideally have 0 dB gain at frequencies around $f_{gbw}$ and higher. It is well known that the efficiency of delta-sigma noise-shaping loops can be improved by increasing the out-of-band gain, i.e., the gain of DTF(s) at frequencies around $f_{gbw}$ and higher. This is also the case for distortion-shaping opamps, but the improvement is less dramatic than it is for delta-sigma noise-shaping loops. Hence, the following discussion will assume that the nominal out-of-band gain of DTF(s) is 0 dB.

Now referring to FIGS. 12 and 17. FIG. 17 shows how the target specification of DTF(s) can be defined. In the signal band, which here is assumed to be the frequency range from 0 Hz to $f_{band}$, the controller [78] should suppress errors by R dB, where R can be 40 dB, 60 dB, or even more. Thus, $-20 \log_{10}[|DTF(j2\pi f)|]$ must be at least R for for signal-band frequencies: $0 < f < f_{band}$. The driving opamp [76] must have a unity-gain frequency $f_{gbw}$ somewhat higher than $f_{band}$. To assure stability, $|DTF(j2\pi f)|$ must be close to unity for frequencies greater than $f_{high}$, where the ratio $f_{gbw}/f_{high} > 1$ reflects a safety margin characterizing the aggressiveness of the design. The ratio $f_{gbw}/f_{high}$ should preferably be as large as possible; 10 is a good (safe) value, but it may be less for critical applications. For frequencies f higher than $f_{high}$, $20 \log_{10}[|DTF(j2\pi f)|]$ should be 0 dB within a small tolerance d. The tolerance d need not be very tight; a value in the range from 1 dB to 3 dB generally yields good results. It is usually not necessary to restrict DTF(s) in the frequency range from $f_{band}$ to $f_{high}$. Thus, in conclusion, $|DTF(j2\pi f)|$ should not attain values in the shaded regions of FIG. 17.

It is well known to those skilled in the art that the minimum order of the transfer function DTF(s) will increase as the minimum signal-band suppression R is increased, and also as the ratio of $f_{band}/f_{high} < 1$ is increased towards unity. Thus, it is difficult to design a distortion-shaping opamp for which the bandwidth $f_{band}$ is more than about 1/10 of the driving opamp's unity-gain frequency $f_{gbw}$. However, considering that modern integrated-circuits technologies allow for the design and implementation of driving opamps with unity-gain frequencies $f_{gbw}$ of several hundred mega-Hertz, it follows that distortion-shaping opamps can be designed to have a very good performance in a bandwidth of, say, 10 mega-Hertz, and sometimes even more. This is a very important aspect of this invention because several important applications, including video and digital communication systems, operate with signals having bandwidths in the low mega-Hertz range.

When $|DTF(j2\pi f)|$ is specified as described above, it is a fairly trivial matter to find a transfer function DTF(s) that fulfills the requirements. Essentially any type of filter approximation technique can be used, particularly including the well-known Butterworth, Chebychev, Bessel, Elliptic, etc. approximations. Chebychev Type-II high-pass filters are found to be particularly useful. The design procedure can be automated using the software package 'MATLAB' (version 4.2) and the corresponding 'SIGNAL TOOLBOX'. The following 7 lines of MATLAB code will find DTF(s) represented by vectors 'Bdtf' and 'Adtf', the coefficients of which represent the numerator and denominator polynomials in 's' of the rational function DTF(s).

```
fgbw=300e6;
fhigh=30e6;
fband=10e6;
R=60;
d=3;
[order, Wn]=cheb2ord(fband, fhigh, d, R, 's')
[Bdtf,Adtf]=cheby2(order, R, fband, 'high', 's')
```

FIG. 18 shows the gain response of the 5th-order filter thereby designed. The specifications are fulfilled.

To design the controller it is necessary to find $H_{cont}(s)$, which can easily be obtained from DTF(s) and Equation 9. Again using MATLAB, we can find the vectors 'Bcont' and 'Acont' representing the numerator and denominator polynomials in 's' of the rational function $H_{cont}(s)$. Two lines of 'MATLAB' code

```
Bcont=Adtf-Bdtf
Acont=Bdtf
``` is all what it takes to do this.

Because errors caused by the driving opamp's [76] output stage are suppressed also by the gain of the driving opamp's input stage, it is sometimes preferable to design $H_{cont}(s)$ to provide relatively more gain at high signal-band frequencies than at lower signal-band frequencies. Similarly, for band-pass applications, $H_{cont}(s)$ may be designed as a band-pass filter.

6.3 Implementation of Higher-Order Controllers

Using the technique described above, $H_{cont}(s)$ will have poles only on the imaginary axis of the S-plane. For the considered example, the poles are s=0, s=±j0.588·2π10 MHz, and s=±j0.951·2π10 MHz. Thus, $H_{cont}(s)$ comprises of two oscillators, one tuned to oscillate at 5.88 MHz and another tuned to oscillate at 9.51 MHz, and an integrator. FIG. 19 shows a suitable implementation. The input stage is an integrator [114] implemented using negative feedback. This way the controller can be made very linear, which is important for the overall performance. The two subsequent stages [116] and [118] are traditional $g_m$–C oscillators tuned to oscillate at the respective frequencies: 5.88 MHz and 9.51 MHz. It is usually not necessary to control the oscillators' [116] [118] losses, because simple resonance is sufficient, and small negative losses do generally not cause instability. However, the poles' quality factor should not be too low.

The transfer function describing the filter shown in FIG. 19 has a numerator equal to one, i.e., the filter's zeros are infinitely far away from s=0. However, as expressed by the polynomial Bcont(s), the controller designed for this example should have four zeros: s=(−0.4590±j1.9261)·2π·10 MHz and s=(−1.3024±j0.7525)·2π·10 MHz. In the same way as for delta-sigma noise-shaping loops, these zeros can be obtained by introducing signal paths in the topology which bypass any integer number of $g_m$–C stages. FIGS. 20 and 21 illustrate two techniques frequently used for the design of $g_m$–C filters. In FIG. 20, an array of four transconductance stages [120] charge the state-variable capacitors by currents proportional to the input signal $V_{in}$. A disadvantage of this topology is that the transconductance stages [120] load the input terminals [122] capacitively. Furthermore, the transconductance stages [120] must be able to handle a large common-mode signal swing. FIG. 21 shows another and typically better technique. Here the zeros in $H_{cont}(s)$ are implemented by calculating $V_{out}$ as a linear combination of the filter's state variables. The state variables are voltage signals, which are converted into current signals by an array of transconductance stages [124]. The summation is performed in the current domain, and the sum current is converted to the voltage control signal $V_{cont}$ by a resistor [126]. The resistor [126] is generally not a physical resistor, but merely a representation of the transconductance of the driving opamp's input stage (the driving opamp is not shown in FIG. 21); i.e., assuming that the offset-control mechanism is implemented as shown in FIG. 15. An advantage of this implementation, in comparison to the implementation shown in FIG. 20, is that only the first stage [127] needs to provide good input-common-mode rejection. Thus, the transconductance stages used in the remainder of the filter circuit can be implemented by each only a few transistors. Although it should be obvious to anyone skilled in the art, let it be specified that the transconductance stages and the capacitors used to implement the controller must be scaled properly to obtain the desired transfer function $H_{cont}(s)$.

Assuming that the controller [130] is implemented as shown in FIG. 21, the overall distortion-shaping opamp may be implemented, e.g., as shown in FIG. 22. The controller [130] suppresses signal-band errors detected in $V_{in}$ by adding a differential current $i_1$ to the current provided by the driving opamp's input stage [128]. Clearly, the part of the current $i_1$ flowing directly to the output $V_{out}$ does only very little good in a single-ended-output opamp; it is important only for fully-differential distortion-shaping opamps. One option is to perform a differential/single-ended conversion of $i_1$, but considering that errors in the current $i_1$ will be suppressed as much as errors caused by the driving opamp's input stage [128] are, it will suffice to generate only the part of $i_1$ that flows to the compensation capacitor [129].

FIG. 23 shows a fully-differential distortion-shaping opamp. The driving opamp's input stage [131] is a traditional folded-cascode stage with differential input for good common-mode rejection. The driving opamp's output stage [132] is very simple; a class-AB output stage employing translinear circuits may be preferable, but is also more complicated. All fully-differential opamps need a common-mode feedback circuit [133], which will also result in class-AB properties for the output stage [132] if it [133] is designed to have a wide bandwidth (for the control of the output stage [132] only; the common-mode control of the input stage [131] should have a lower bandwidth for stability). The controller's feed-forward transconductance stages [124] are the same as was shown in FIG. 22. For simplicity, they are implemented using differential pairs operating in parallel with the opamp's input stage [131]. The integrator and the two resonators, [134], can be implemented using $g_m$C filter stages as was shown in FIG. 22. An alternative implementation of this block [134], based on opamps with negative feedback, is shown in FIG. 24. The advantage of this structure, besides is superior linearity, is that the controller's frequency response depends on only the passive components' values, i.e., matching transconductance to resistors is not an issue.

6.4 Digital-to-Analog Converter

The concept of having a wide-bandwidth driving circuit monitored and controlled by a controller with less bandwidth can be generalized recursively. In fact, the concept can be generalized recursively in two (both) directions. Clearly, the controller can be monitored by a highly-accurate low-bandwidth circuit adjusting the offset to a very small value. However, more interesting is the combination of a distortion-shaping opamp with a circuit having even higher bandwidth than the driving opamp. Assuming that the driving opamp has been designed to be as fast as possible, only open-loop circuits can provide a higher bandwidth. Considering that open-loop circuits generally are subject to significant distortion and other errors, the combination of an open-loop circuit and a distortion-shaping opamp is promising.

Distortion-shaping opamps are useful for almost any negative-feedback circuit providing an output signal continuous in time. Among the many interesting applications, current-to-voltage conversion of a current signal provided by a current-mode digital-to-analog converter is a particularly important one. It is, therefore, interesting that the combination of a distortion-shaping opamp with an open-loop circuit is particularly suitable for this specific application. FIG. 25 shows the basic concept.

A driving current-mode DAC [140] is connected directly to the load [147]. It is assumed that the load can be modeled as a capacitor [148] in parallel with a resistor [150]. The output signal is defined as the voltage $V_{out}$ across the load [147], and the driving DAC [140], therefore, inherently implements an open-loop signal path. A reference current-mode DAC [142] is connected to the inverting input terminal [152] of an opamp [152]. The opamp [152] is preferably a distortion-shaping one, i.e., implemented according to FIG. 12 with a wide-bandwidth controller [78]. The operational amplifier [152] is operated in a negative-feedback configuration; an impedance element [143] (a parallel combination of a capacitor [144] and a resistor [146]) provides negative feedback. The so-called Kelvin force-sense wiring scheme [152] should be used to achieve the best performance.

The operation is as follows. The two DACs [140] and [142] are converting the same digital input signal d(k). Their nominal outputs are the current signals $I_1(t)=I_{ref,1} \cdot d_h(t)$ and $I_2(t)=I_{ref,2} \cdot d_h(t)$, where $d_h(t)$ represents d(k) subject to an appropriate impulse response, say a zero-order-holding one. Notice that the driving DAC [140] sources current $I_1$, whereas the reference DAC [142] drains current $I_2$.

The opamp [152] ultimately controls the output voltage; it can be considered as the global-level controller. Ideally the opamp [152] should provide only very little current and essentially only monitor the output voltage and make small corrections (i.e., supply current) when necessary. For that to be the case, the ratio of the two DACs' [140][142] reference currents, must be one plus the ratio of the resistive feedback and the resistive load:

$$\frac{I_{ref,1}}{I_{ref,2}} = \frac{R_f}{R_{load}} + 1. \tag{10}$$

Furthermore, to avoid that the opamp [152] needs to provide transient currents, the time constants of the load [147] and the impedance element [143] should be the same:

$$C_f R_f = C_{load} R_{load}. \tag{11}$$

Equations 10 and 11 need not be fulfilled very accurately, but if $I_{opamp}$ is more than (say)±10% of $I_{load}$, the driving DAC [140] serves only little purpose. The problem is easily solved if the load's [147] impedance is well known, but that is not always the case. A control mechanism that can adjust the driving DAC's gain $I_{ref,1}$ is needed for the more general case. Such a control mechanism may have a very low bandwidth because it is to adapt to a static disturbance.

6.4.1 Adapting to the Resistive Load

Assume that the capacitive elements [144] and [148] are zero: $C_{load}=C_f=0$. The product of the digital signal and the current provided by the opamp [152], $d(k) I_{opamp}(t)$, has the opposite polarity as that of the error in $I_{ref,1}$. A simple nonlinear control mechanism implementing:

$$I_{ref,1}(t) = \gamma \cdot \int d(k) \cdot I_{opamp}(t) dt \tag{12}$$

will be stable and converge towards the correct value if γ is a sufficiently small constant. For simplicity, and to linearize the control system, it is preferable to truncate d(k) to a few bits of resolution in the calculation of $\gamma \cdot d(k) \cdot I_{opamp}(t)$. This also makes the gain γ a decreasing function of d(k). A suitable implementation is shown in FIG. 26.

Transistors [154] and [156] implement the opamp's [152] output stage. The opamp's [152] current $I_{opamp}$ is replicated in two arrays of transistors [158] and [160], which generate a current $I_{gain}$ as a nonlinear function $\gamma \cdot I_{opamp} \cdot d^*(k)$, where $d^*(k)$ is d(k) truncated to a few bits of resolution. Each transistor array [158][160] consist of only a few (say four) scaled transistors. By scaling the transistor arrays [158] and [160] properly, it is simple to decrease the gain factor γ for increasing values of $d^*(k)$. The control current $I_{gain}$ is being integrated on a (large) integrating capacitor [162]. The reference current $I_{ref,1}$ controlling the driving DAC's [140] gain is generated as an increasing function of the voltage across the integrating capacitor [162] using a NMOS transistor [164]. This control mechanism is clearly a very crude and nonlinear one, but it is generally sufficiently good for the purpose. The control system should preferably be made very slow with time constants in the order of seconds. To avoid the need for off-chip capacitors, the integration may instead be implemented in the digital domain.

6.4.2 Adapting to the Capacitive Load

It is equally simple to detect whether $C_{load}$ is larger or smaller than the target value described by Equation 11. When the driving DAC's [140] gain $I_{ref,1}$ has settled to its static value and $C_{load}$ is too large, the current $I_{opamp}$ provided by the opamp [152] will have the same polarity as that of the first derivative of d(k). Similarly, when $C_{load}$ is too small the current $I_{opamp}$ provided by the opamp [152] will have the opposite polarity as that of the first derivative of d(k). Hence, the detection can be performed by a circuit similar to that shown in FIG. 26 where the transistor arrays [158] and [160] are controlled by d(k)−d(k−1), possibly truncated.

Unfortunately, $C_{load}$ cannot be easily adjusted. Hence, the simplest way to fulfill Equation 11 is to adjust the capacitor [144]. However, the impedance element [143] should not be changed dynamically because that will cause distortion. In other words, the capacitance $C_f$ should be adjusted only during a power-up calibration period, and then attain a constant value, or at most be altered at very rare occasions. The better solution is to use a third differentiating D/A converter to provide/drain the charge required to charge $C_{load}$ with the time constant defined by the impedance element [143]. This solution does not honor Equation 11, but it does prevent the opamp [152] from providing large currents which is the overall objective.

FIG. 27 shows the proposed system. A truncation block [166] has been included appreciating that errors comprised in the feedforward current $I_1+I_0$ will be compensated for by the opamp [152]. If the truncation is very coarse, dither should be added to avoid large harmonic spurs in $I_1+I_0$, which are relatively harder to fully compensate for. Ideally, the truncation will be performed by a noise-shaping loop, but that is generally not necessary. The reference DAC [142] is assumed to have a zero-order holding impulse response, i.e., the current $I_2$ is constant until the next value of d(k) is applied. The control system [164] and the driving DAC [140] were shown in FIG. 26. The DAC [140] has the same zero-order-holding impulse response. The differentiating DAC [170] provides a current signal $I_0$ required to charge the mismatched capacitance $C_{load}-C_f(R_f/R_{load})$ with the impedance element's [143] time constant. Thus, this DAC's [170] impulse response $d_r(t)$ should be a decaying exponential with the impedance element's [143] time constant:

$$d_\tau(t) = \begin{cases} 0 & \text{for } t < 0 \\ I_{ref,0} \cdot \exp(-t/R_f \cdot C_f) & \text{for } 0 \le t \le T_s \\ 0 & \text{for } T_s < t \end{cases} \tag{13}$$

The differentiating DAC's control system [172] is implemented in essentially the same way as the driving DAC's control system [164]; for completeness it is shown in FIG. 28. Here, $I_{tau}$ represents the error signal, which is being integrated on a capacitor [174]. The differentiating DAC [170] is implemented as shown in FIG. 29. A switched RC network [175] provides exponentially-decaying current pulses, proportional to the integral of the current $I_{tau}$, at each transition from one value of d(k) to the next. The time constants of the resistor [180] and each of the two capacitors [176] [178] match the impedance's element [143] time constant (FIG. 27). The decaying current pulses are dumped to a low-impedance node of a current mirror [182] used to bias two arrays of current sources [184] [186]. The current sources [184] [186] are switched to the output terminal [188] as a function of the difference signal: d(k)–d(k–1).

7 Conclusion, Ramification, and Scope of Invention

The reader will see that negative-feedback systems can be designed to provide an excellent linear performance in an unusually wide bandwidth.

Consider a single-dominating-pole opamp designed to be as fast as possible within the constraints set forth by the technology used, the power consumption allowed, and the load to be driven. A negative-feedback system implemented on the basis of this opamp and a linear feedback network will generally perform poorly (when providing a full-scale output signal) if the signal-band extends to frequencies close to the opamp's unity-gain frequency. This invention offers a compensation technique by which excellent performance can be achieved in a bandwidth which extends from 0 Hertz to approximately one tenth of the opamp's unity-gain frequency; that is a very significant improvement.

The unusually good performance is obtained by combining a traditional (signal-generating) negative-feedback system with an error-shaping control loop. Such composite circuits are referred to as "distortion-shaping" circuits/systems. The error-shaping loop compensates for errors caused by the signal-generating system by inducing an offset in the driving opamp on which the signal-generating system is based The driving opamp's offset can be controlled efficiently in the frequency range in which the signal-generating system's loop gain $|\beta(s) H_{opamp}(s)|$ is at least (say) ten. In this frequency range the error-shaping control loop will be essentially independent of the signal-generating system. In other words, for the majority of the commonly-used linear feedback networks, the error-shaping control loop can be designed independently of the signal-generating system. Hence, distortion-shaping opamps can be used in the place of traditional general-purpose opamps; they can be produced and sold as standard products because they need not be customized for each application.

The error-shaping control loop is based on a so-called controller. The controller monitors the driving opamp's input voltage (which represents all errors: linear finite-gain errors as well as nonlinear errors) and adjusts the driving opamp's offset such as to minimize the input voltage in a selected frequency range (the signal band). Clearly, the performance will not be any better than the linearity of the controller's input stage. However, there are two main reasons why the controller can be designed to be very linear in a wide bandwidth. The first reason is that the driving opamp's input voltage generally will be a relatively small signal; most circuit's linearity increases drastically when the signal magnitude is reduced. The second reason is that the controller's input stage can be implemented as a closed-loop system suppressing high-frequency spectral components; thus, it will not be subject to the same problems/limitations as the signal-generating system.

Although is it to be understood that distortion-shaping opamps can be used for many applications different in nature, their use as buffers/drivers for high-speed digital communication systems, such as xDSL modems, is considered to be particularly important. This is because such buffers are very difficult to design using traditional techniques. Distortion-shaping opamps per se are very useful for the implementation of such buffers, but a certain variant of this invention is particularly useful for their implementation. In this variant, an open-loop current-mode D/A converter directly drives the communication channel, say a telephone cable. Because this D/A converter is not part of a wide-bandwidth closed-loop circuit, adding a current to the output signal is an infinite-bandwidth offset-control mechanism. Thus, using a voltage-mode D/A converter (driven by the same digital input signal) in parallel with the current-mode D/A converter can be construed as providing a controller for the driving current-mode D/A converter. The voltage-mode D/A converter can be implemented using a second (reference) current-mode D/A converter, an opamp, and a simple one-port feedback network for current-to-voltage conversion. The opamp should preferably be a distortion-shaping one. The voltage-mode D/A converter should ideally provide as little current as possible (to enhance its linearity). Thus, it is useful to implement a low-bandwidth control loop to match the driving D/A converter's gain to the communication channel's impedance. The driving D/A converter can be a very crude one, possibly re-quantizing the digital signal before it is D/A converted. By introducing a third differentiating current-mode D/A converter, the system can adapt also to the load's reactive component.

It is to be understood that while the above description contains many specificities, these should not be construed as limitations of the scope of the invention, but rather as an exemplification of several preferred embodiments thereof. Many other variations are possible. For example, the technique can be used for negative-feedback systems with almost arbitrary linear feedback networks, for example implementing low-pass, band-pass, and high-pass filter functions. Although the invention's advantages for wide-bandwidth applications have been emphasized, the technique is also very useful for the implementation of systems having a relatively low bandwidth, for example, audio power amplifiers (typically driving a "difficult" load: a loudspeaker) and general high-performance audio applications. Because cross-over distortion in class-AB amplifiers can be efficiently suppressed, the technique is also very useful for low-voltage systems of any bandwidth. Discrete-to-continuous-time conversion of signals provided by analog-sampled-data circuits is another application for which distortion-shaping techniques are most useful. Clearly, the invention can be used in combination with any integrated-circuits technology (bipolar, GaAs, CMOS, etc.) as well as for discrete-components circuits; the controller and the driving opamp may have any combination of single-ended/differential/dual-differential inputs and single-ended/differential outputs; the driving opamp may have any integer number of stages (including only one stage); the controller may be implemented using active/passive circuitry, in any topology, of any order, and with any frequency response; and the offset control mechanism may be implemented in alternative ways. Those skilled in the art will understand that many other variations and alterations are possible without departing from the spirit and scope of this invention.

Accordingly, the scope of invention should be determined not by the embodiments, but by the appended claims and their legal equivalents.

I claim:

1. An amplifying circuit coupled in a negative-feedback configuration, receiving an input voltage and providing an output voltage, comprising
   (a) a driving circuit receiving said input voltage and a control signal, and providing said output voltage; said driving circuit in said negative-feedback configuration being characterized by a first transfer function calculated from said control signal to said input voltage; said first transfer function having a dominating pole at a first frequency; and (b) a controller circuit receiving said input voltage and providing said control signal; said controller circuit in itself being characterized by a second transfer function calculated from said input voltage to said control signal; said second transfer function having at least two poles in the frequency range from zero hertz to said first frequency.

2. The amplifying circuit of claim 1 wherein (a) said second transfer function comprises at least one pair of complex-conjugate poles with a quality factor of at least two in the amplifying circuit's signal band.

3. The amplifying circuit of claim 1 wherein the magnitude of the product of said first transfer function and said second transfer function is greater than unity at all frequencies below said first frequency divided by fifty.

4. The amplifying circuit of claim 1 wherein the magnitude of the product of said first transfer function and said second transfer function is less than unity at all frequencies higher than said first frequency divided by three.

5. The amplifying circuit of claim 1 wherein (a) the driving circuit comprises a first input stage;

(b) the controller circuit comprises a second input stage; and (c) said second input stage is designed to have a wider linear input range than said first input stage.

6. The amplifying circuit of claim 5 wherein (a) said second input stage is a least six deci bell more linear than said first input stage when compared with respect to a sinusoidal input signal with a magnitude of one tenth of a volt and oscillating at the amplifying circuit's highest signal-band frequency.

7. The amplifying circuit of claim 5 wherein (a) resistors are used to linearize said second input stage.

8. The amplifying circuit of claim 5 wherein (a) negative feedback is used to linearize said second input stage.

9. The amplifying circuit of claim 5 wherein (a) the transconductance of said first input stage is substantially higher than the transconductance of said second input stage.

10. The amplifying circuit of claim 1 wherein (a) the voltage swing at any node in said controller circuit is substantially smaller than the swing of said output voltage.

11. The amplifying circuit of claim 1 further comprising (a) an impedance element providing negative feedback for said amplifying circuit; and (b) a digital-to-analog converter providing a current signal flowing through said impedance element.

12. The amplifying circuit of claim 11 wherein (a) said impedance element has a relatively higher impedance at frequencies in the amplifying circuit's signal band.

13. A method for linearizing a negative-feedback system, which receives an input signal and provides an output signal, comprising the steps of:

(a) providing a linear network generating an error signal as a linear function of said input signal and said output signal;

(b) generating a first signal proportional to said error signal; the phase delay of said first signal with respect to said error signal being negligible in a first frequency range wider than said negative-feedback system's bandwidth;

(c) generating a second signal by selectively amplifying the error signal's spectral components in said negative-feedback system's signal band with a filter of at least second order; and (d) generating said output signal by combining said first signal and said second signal.

14. The method of claim 13 wherein the step of generating said second signal is implemented to have a better large-signal linearity than the large-signal linearity of the generation of said first signal.

15. The method of claim 13 wherein the step of generating said output signal comprises the steps of:

(a) generating a sum signal by adding said first signal and said second signal; and (b) integrating the sum signal.

16. The method of claim 13 wherein said error signal is a voltage signal, and the step of generating said first signal comprises the step of:

(a) generating a differential current signal using a transconductance stage comprising a differential pair.

17. The method of claim 16 wherein the absolute level of distortion produced by said differential pair, when providing a full-scale output signal during normal operation, may be substantially higher than the distortion level reflected by the error signal.

18. The method of claim 13 wherein the step of generating said second signal comprises the step of (a) providing negative feedback.

19. The method of claim 13 wherein the step of calculating said second signal comprises the step of (a) amplifying the error signal with a circuit having a pair of complex-conjugate poles at a high signal-band frequency.

20. The method of claim 13 wherein the step of generating said second signal comprises the step of (a) providing a linear filter, which would have poles and zeros essentially equivalent to those of a chebychev high-pass filter, if configured in the unity-gain configuration.

* * * * *